United States Patent [19]
Cheng et al.

[11] Patent Number: 4,819,167
[45] Date of Patent: Apr. 4, 1989

[54] SYSTEM AND METHOD FOR DETECTING THE CENTER OF AN INTEGRATED CIRCUIT WAFER

[75] Inventors: David Cheng, San Jose; Wesley W. Zhang, Burlingame, both of Calif.

[73] Assignee: Applied Materials, Inc., Santa Clara, Calif.

[21] Appl. No.: 40,974

[22] Filed: Apr. 20, 1987

[51] Int. Cl.$^4$ .................. G06F 15/46; G21K 5/10; B65H 1/00
[52] U.S. Cl. ..................... 364/167.01; 250/442.1; 318/640; 364/513; 364/559; 414/225; 901/6; 901/47
[58] Field of Search ........ 364/478, 513, 559, 167–171, 364/488–491; 118/728–733; 356/399–401; 250/548, 441.1, 442.1, 491.1, 492.2; 318/640; 414/217, 222, 225, 417; 901/6, 7, 46, 47; 198/341, 345

[56] References Cited

U.S. PATENT DOCUMENTS

| 4,449,885 | 5/1984 | Hertel et al. | 414/417 X |
| 4,507,078 | 3/1985 | Tam et al. | 198/341 X |
| 4,523,985 | 6/1985 | Dimock | 414/217 X |
| 4,647,266 | 3/1987 | Coad et al. | 414/225 |
| 4,705,951 | 11/1987 | Layman et al. | 250/442.1 |
| 4,720,635 | 1/1988 | Uga | 250/548 |

Primary Examiner—Joseph Ruggiero
Attorney, Agent, or Firm—Flehr, Hohbach, Test, Albritton & Herbert

[57] ABSTRACT

A system and method for determining the precise location of a moving object such as a semiconductor wafer relative to a destination position, using an array of optical sensors positioned along an axis generally transverse to the path of movement of the wafer. The sensor trigger points along the path of movement are used to calculate the center position of the wafer relative to the destination position.

10 Claims, 7 Drawing Sheets

४,८१९,१६७

SYSTEM AND METHOD FOR DETECTING THE CENTER OF AN INTEGRATED CIRCUIT WAFER

BACKGROUND OF THE INVENTION

The present invention relates to apparatus and methods for precisely detecting the position of a moving object carried by a robot as an aid to the precise transfer of that object and, in particular, to apparatus and methods for precisely determining the position of a moving integrated circuit wafer on a robot arm relative to a storage elevator.

FIGS. 1 and 2 depict a multiple chamber wafer fabrication system 10, which is described in greater detail in the Detailed Description. In system 10, wafers 15 are transported on blade 31 of robot 30 between an external cassette elevator 18 and an internal loadlock storage elevator 19, between the internal elevator 19 and one or more (preferably a multiplicity of) processing chambers 12, and between the chambers. This system is compact and presents precise tolerance requirements, for example, for loading the internal loadlock storage cassette 19 from the external elevator 18. As a consequence of the tight tolerances and the resulting need to precisely insert each wafer 15 into the internal loadlock storage cassette 19, the position of each wafer must be precisely determined relative to the robot blade 31 after the wafer is unloaded from the external cassette elevator 18. This determination is complicated by the movement of the wafer 15 and, specifically, by the operational preference for determining the position of the wafer without interrupting movement of the robot and wafer.

SUMMARY OF THE INVENTION

The present invention actually takes advantage of the movement of the wafer in obtaining the necessary position information and, thus, provides the required very precise position information without stopping movement of the robot.

In one aspect, the present invention comprises a system for detecting the locus relative to a selected point of an object having leading and trailing edges, such as a semiconductor wafer, positioned on a moving support, and for moving the support and object to the selected point. The system comprises an array of sensors arranged generally traverse to the path of movement of the object for being selectively triggered by the movement of the leading and trailing edges thereof to generate associated output signals; means responsive to the output signals for determining the location of the wafer relative to the selected points; and means responsive to the relative location of the object for moving the support and the object positioned thereon to the selected point.

In the presently preferred embodiment, the object is a generally circular semiconductor wafer, the position determining means is a processor or computer adapted for calculating the center of said wafer; and the sensor array comprises three sensors.

Also, the support means may comprise a robot support arm for the wafer and a dual four-bar link mechanism operatively connected to and supporting the robot support arm; and the responsive moving means may comprise a rotatable shaft connected to a selected drive arm of the four-bar link mechanism for reciprocally pivoting the drive arm to extend and retract the robot support arm along the path of movement.

In another aspect, the present invention is directed to a method for detecting the locus relative to a selected point of an object having leading and trailing edges, such as a semiconductor wafer, positioned on a moving support, and for moving the support and object to the selected point, comprising: providing a plurality of sensors arranged generally transverse to the path of movement; moving the object along the path to cause leading and trailing of the object to selectively trigger the sensors, to thereby generate associated output signals; responsive to the output signals, calculating the location of the object relative to the selected point; and responsive to the calculation of said relative location, moving the object to the selected point.

Preferably, the step of calculating the center of the wafer comprises, first, determining the center of the wafer along a coordinate axis defined generally parallel to the path of movement and, second, using the first center coordinate to determine the center of the wafer along a second coordinate axis.

BRIEF DESCRIPTION OF THE DRAWINGS

The above and other aspects of the present invention are described with respect to the drawings in which.

DETAILED DESCRIPTION OF THE PREFERRED EMBODIMENT(S)

1. Overview of Wafer Handling and Processing System

Figure 1:
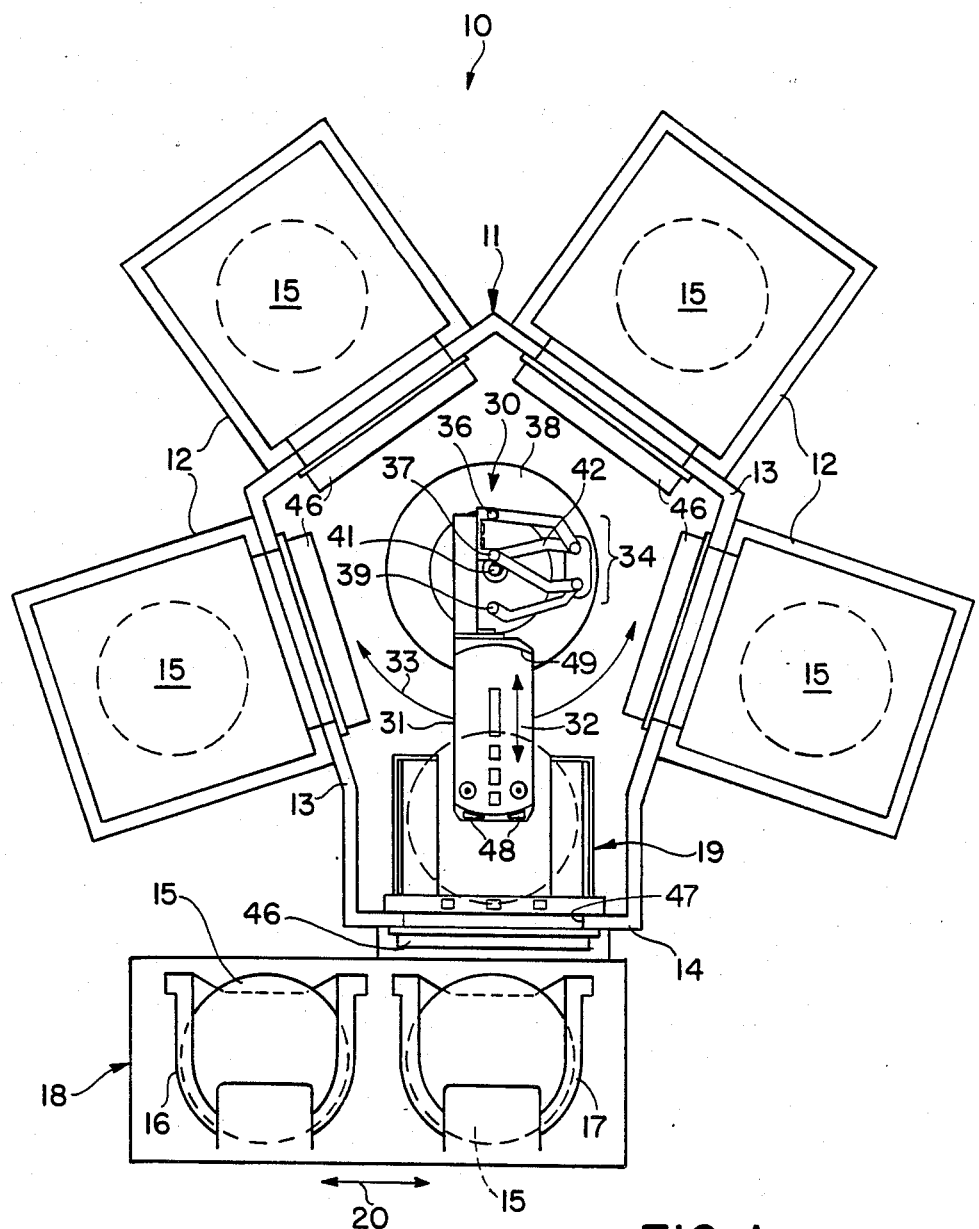
FIGS. 1 and 2, are respectively, a top plan view and a vertical sectional view of an integrated circuit processing system which incorporates our wafer center-finder system.
Figure 2:
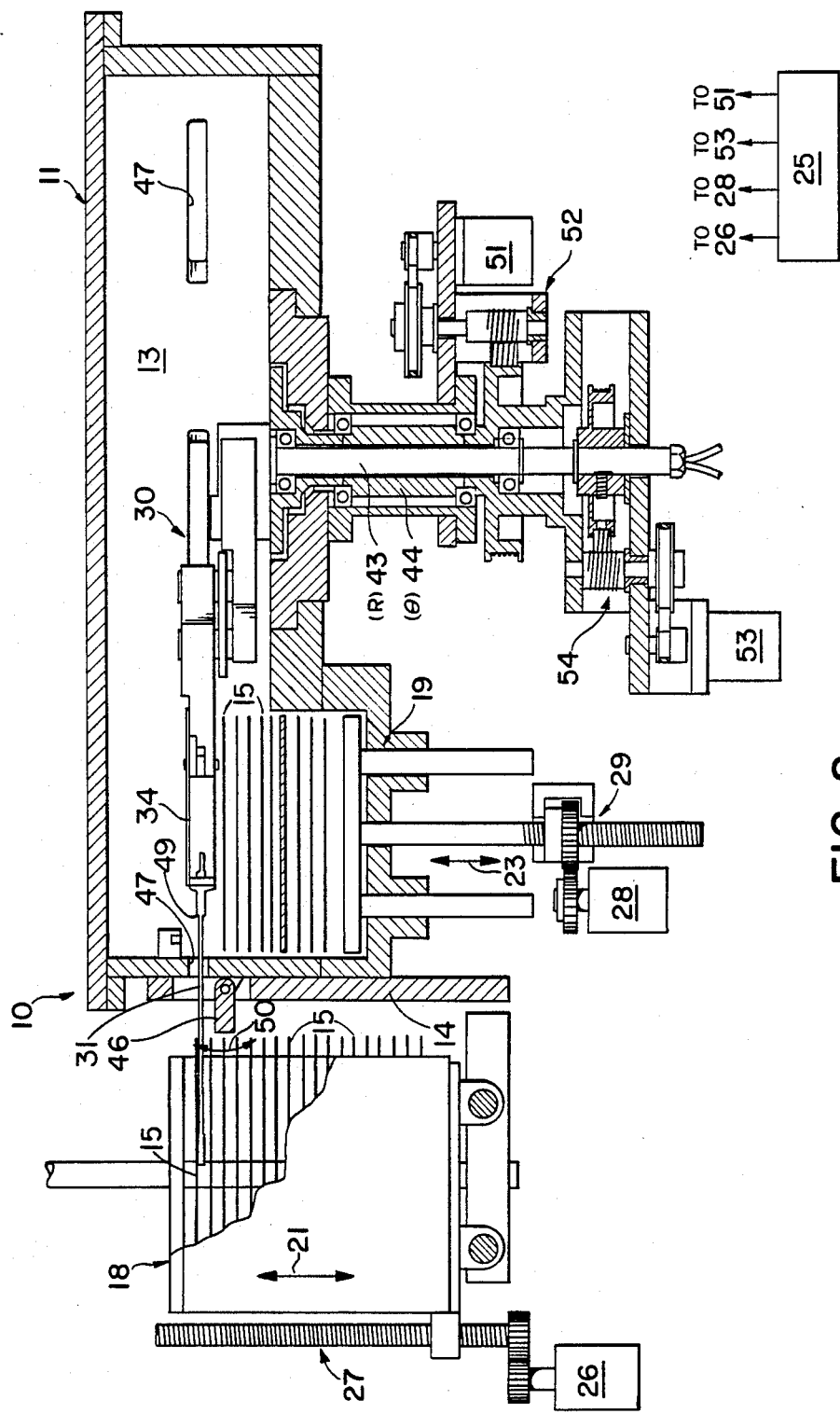

FIGS. 1 and 2 are, respectively, a top plan view and a vertical sectional view of an integrated circuit processing system 10 of the type which benefits from the use of our wafer center-finder system. The multiple chamber processing system 10 is described in detail in co-pending, commonly assigned, Allamed U.S. patent application Ser. No. 944,803, entitled MULTI-CHAMBER INTEGRATED PROCESS SYSTEM, filed Dec. 19, 1986, in the name of MAYDAN ET AL, which applicatidn is hereby incorporated by reference in its entirety. Referring to FIGS. 1 and 2, illustratively, the multiple chamber system 10 comprises an enclosed, generally polygonal-shaped vacuum loadlock chamber 11 which mounts the four discrete, single-wafer, vacuum processing chambers 12 on associated loadlock chamber walls 13 for processing the wafers 15, which are initially contained in standard plastic cassettes 16 and 17. These cassettes are positioned on the external cassette elevator 18 which is positioned adjacent the fifth, front chamber wall 14.

As indicated by arrows 20 (FIG. 1) and 21 (FIG. 2), the external cassette elevator 18 is indexable, horizontally and vertically. Internal storage elevator 19 is vertically indexable along path 23. For example, computer-controlled, stepper motor-driven lead screw drive systems may be used to position the elevators for loading unprocessed wafers into storage elevator 19 in the loadlock chamber 11, and returning processed wafers, for off-loading the internal elevator 19 into the chambers 12 and for returning wafers to the internal elevator. FIG. 2 depicts exemplary indexing vertical motion drive systems: stepper motor 26-driven lead screw drive 27 for reciprocally indexing the external elevator 18 and stepper motor 28-driven lead screw drive 29 for reciprocally indexing the internal storage elevator 19. The motors preferably are controlled by a microcomputer 25 such as the IBM Personal Computer.

The robot 30 is used to transfer wafers between the external atmospheric pressure elevator 18 and the internal storage elevator 19, as well as between the internal elevator 19 and the processing chambers 12. The robot 30 comprises a wafer transfer blade 31 which is mounted for reversible linear translation indicated by arrow 32 (R movement) and reversible rotation indicated by arrow 33 ($\theta$ movement). See FIG. 1.

Specifically, the robot 30 comprises a four-bar link mechanism 34 which mounts the end effector/blade 31 at link ends 36 and 37. Opposite link ends 39 and 41 of the mechanism 26 are mounted to platform 38. A concentric shaft drive mechanism effects R and $\theta$ movement. That is, drive link 42 of the dual four-bar link mechanism 34 is connected at end 41 thereof to one rotatable drive shaft 43 (FIG. 2), rotation of which causes the four-bar link mechanism 34 to extend and retract the blade 31 along the R path 32. A second concentric rotatable shaft 44 mounts and rotates the platform 38 and so imparts reversible $\theta$ movement to the blade 31 along path 33. Computer 25-controlled, motor 51-driven cable and drum drive system 52 rotates $\theta$ shaft 44, while motor 53-driven cable and drum drive 54 rotates R shaft 43. Quite obviously, selected combinations of R and $\theta$ movement permit extending the blade 31 into the casserte 18 for loading and unloading wafers there, extending the blade into internal cassette elevator 19 for unloading and loading wafers there, and pivotal orientation at and extension of the blade into a selected chamber or chambers 12 for loading and off-loading wafers at the single wafer horizontal support position illustrated in phantom in each of the chambers.

After wafers 15 are loaded onto the internal storage elevator 19 from the external elevator 18, the loadlock chamber slit valve 46 is closed over entrance slit 47 (FIG. 2) and single or multiple step processing can be applied to the wafers 15—15 in the chambers 12 without breaking vacuum. Alternatively, additional wafers can be loaded into the elevator 19 while others are being processed in the chambers 12, and the loadlock chamber 11 returned to vacuum for unloading and reloading the chambers 12.

A slit valve 46 is pivotally mounted at each of the slits 47 as indicated by arrow 50, FIG. 2, for closing the associated slit to vacuum isolate the associated chamber(s) and for opening the slit to permit wafer transfer. In a presently preferred embodiment, the slit valves are opened and are closed by an air cylinder-operated cam system under control of computer 25. This slit valve system is disclosed in co-pending, commonly application, Allamed U.S. patent application Ser. No. 040,287, entitled VACUUM CHAMBER SLIT VALVE, filed on the same date as the present application, in the name of Masato Toshima, which application is hereby incorporated by reference in its entirety.

2. Bases for Requirement of Precise Wafer Handling

Referring further to FIGS. 1 and 2, as described above, the versatile, compact system 10 has very precise wafer handling and positioning requirementsThe end of the robot transfer blade 31 incorporates vacuum orifices 48—48 (FIG. 1) which permit the blade 31 to be used as pick for off-loading wafers 15 from the cassette 18 into the interaal storage elevator and vice versa. Preferably, a pocket 49 in the blade 31 holds wafers 15 during transfer between the internal elevator 19 and the chambers 12 and between the chambers. However, the individual wafers 15—15 are not positioned precisely the same within the respective cassettes 16 and 17 and are not positioned identically on the blade 31. Thus, after the wafer 15 has been off-loaded from a cassette 16 or 17, the precise location of the wafer 15 on the blade 31 must be provided to the controlling computer 25. Only if this is done can computer 25 adjust to the variable position of each wafer 15 and deposit the wafer precisely in position within the storage elevator 19.

3. Optical Wafer Scanning System

Figure 3:
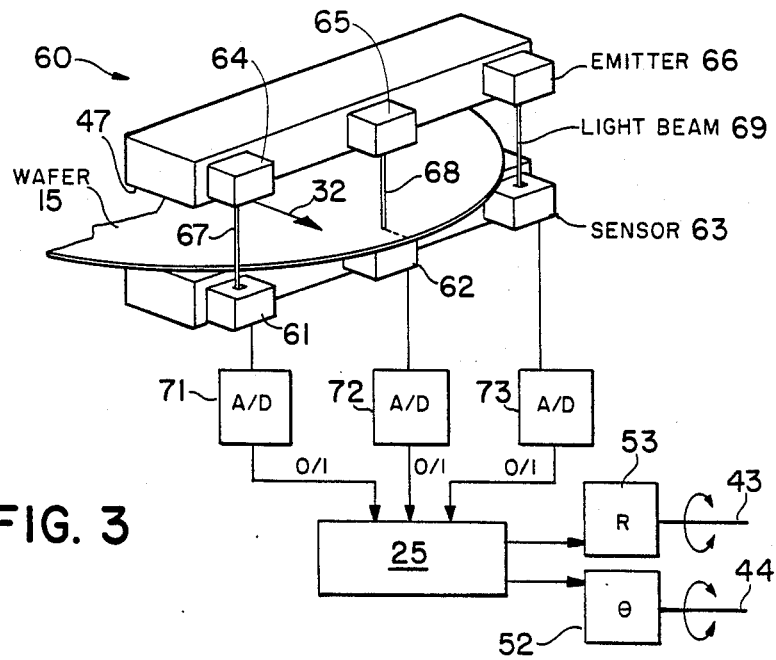
FIG. 3 schematically depicts an embodiment of the optical wafer detection, wafer center determination, motor control system of the present invention.

Referring further to FIGS. 1 and 2 and, in particular, to FIG. 3, optical sensing system 60 provides wafer position data (the center coordinate of the wafer) which enables the robot 30 to precisely position the wafer 15 in the internal storage cassette 19. This system 60 comprises three optical sensors 61–63 mounted beneath the loadlock front entrance slit 47 along a line perpendicular to the path 32 of the robot blade 31 and three optical emitters 64–66 positioned above the front entrance slit 47 aligned with the associated sensors so that the sensors intercept the light beams 67–69 from the associated emitters. Typically, each pair comprises a conventional infrared emitter and sensor.

Referring further to FIG. 3, the output from the sensors 61–63 is converted by associated analog-to-digital converters 71–73 into digital 0/1 signals. These signals are applied as input to system computer 25 for use in computing the center coordinate of the wafer 15 as it enters the loadlock chamber 11, and controlling the operation of the R and $\theta$ drive motors, as well as the other drive motors, via appropriate conventional position feedback sensors, etc., as required and desired to enable the required precise positioning operations of the robot 30, i.e., positioning by the robot 30 of the wafer 15 at the internal cassette elevator 19. Details of the sensing and motor control circuitry are conventional and will be readily tailored by those of usual skill in the art to a particular system. Thus, such details are not discussed in depth here.

4. Definition of Coordinate System and Wafer Data Points

Figure 5:
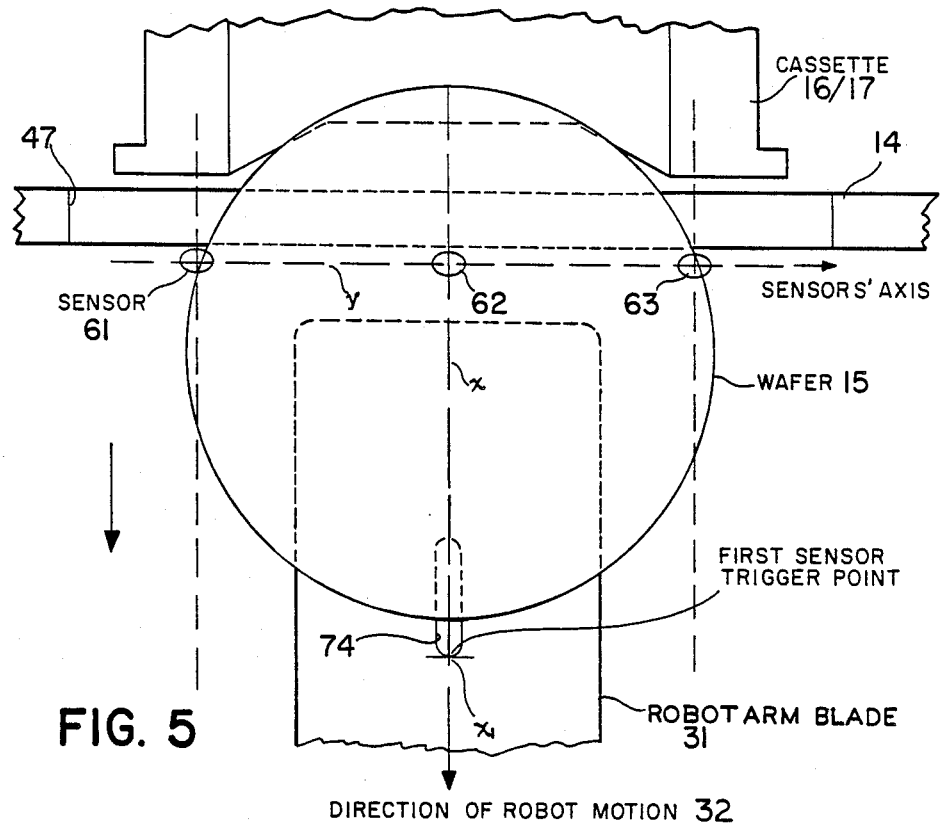
FIG. 5 is an enlarged view, similar a top plan view, illustrating the coordinate system used in the center-finder computation and the relationship of the coordinate system to the robot blade, the wafer and the sensor array.

As shown in FIG. 5, an x,y coordinate system is conveniently defined by the optical sensors and robot path 32. The origin (0,0) of the xy coordinate system is defined by the position of the center sensor 62. The x axis is the path of the robot arm/blade 31; the y axis is the center line of the three sensors. Because of the non-linear relationship between motor steps and blade position, preferably a look-up table is provided in the computer memory to provide the x coordinate associated with each step.

Figure 4:
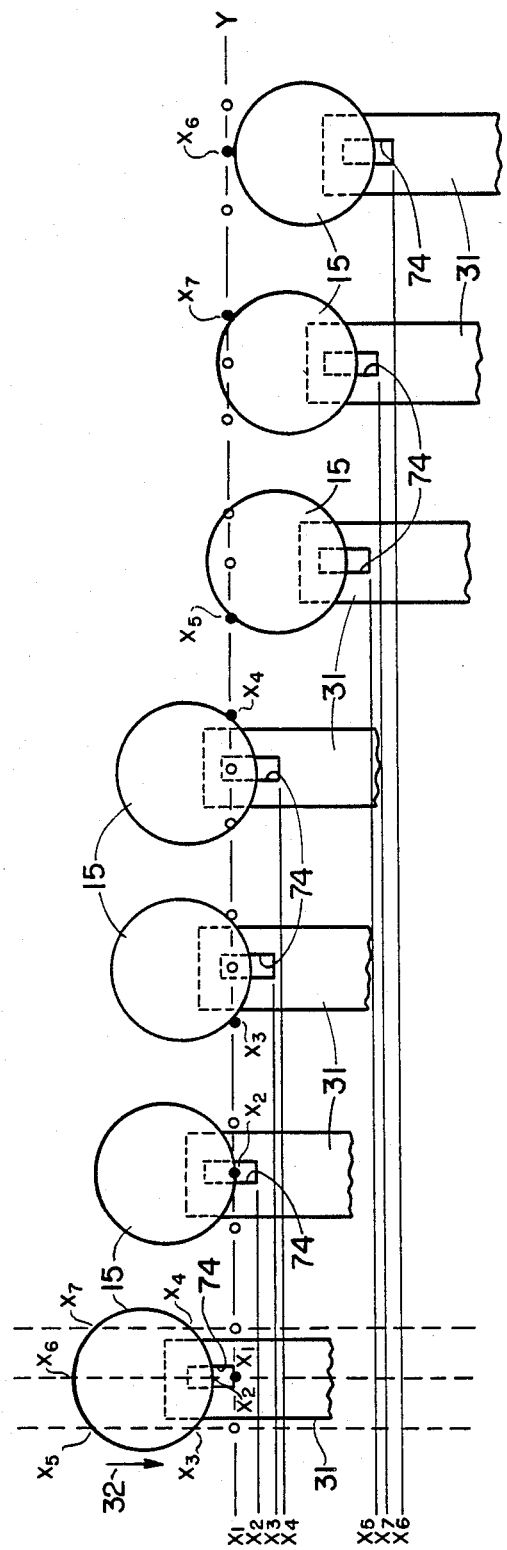
FIG. 4 schematically depicts the seven coordinate positions used for determining the position of the wafer relative to a selected position such as a storage elevator, the seven trigger points on the robot blade and wafer and their corresponding positions along the axis of blade and wafer movement.
Figure 6:
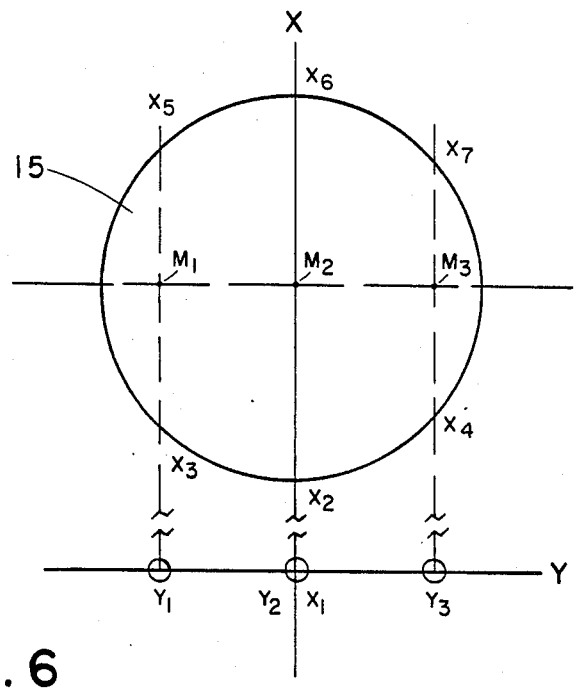
FIG. 6 depicts the relationship of the seven trigger points to the sensor array and coordinate system.

Referring to FIGS. 4, 5 and 6, seven coordinate points are used for the wafer center coordinate calculation: a robot blade reference position and six wafer positions. These seven positions are defined as the blade 31 is withdrawn from the external elevator 18 parallel to the x axis, thereby moving the blade 31 and wafer 15 through the light beams 67-69 and sequentially blocking/unblocking the sensors 61-63. These seven coordinate positions are arbitrarily designated $x_1$ through $x_7$ in FIGS. 4 and 6.

Referring to FIGS. 3-6, the first coordinate, $x_1$, is determined by the leading edge of wafer blade slot 74 (FIG. 5). That is, sensor 62 is unblocked and a resulting "1" signal is applied to the computer 25, as the leading edge of slot 74 traverses the sensor position. Upon continued movement of the blade 31 along the x axis toward and into the loadlock chamber 11, the sensors 62, 61 and 63 are sequentially blocked by the leading edge of the moving wafer 31, changing the associated input signal to the computer 25 from "1" to "0" to provide the motor's associated extension position for storage in computer memory as respective positions $x_2$, $x_3$ and $x_4$. Conversely, as the wafer 15 completes its traverse of the sensor positions, the sensors 61, 62 and 63 are sequentially unblocked and the motor's extension position associated with the resulting change of the input signal from "0" to "1" is recorded in computer memory as positions $x_5$, $x_6$ and $x_7$, respectively.

It should be noted that the sequence may not and need not be precisely as indicated. That is, for example, $x_4$ may be located closer to $x_1$ along the x direction than is $x_3$ (for example, because a wafer flat is located at $x_3$ or simply because of variations in the position of the wafer on the blade 31), with the result that $x_4$ is detected prior to $x_3$. Similarly, $x_7$ may be closer to $x_1$ than is $x_5$ (again, because of the orientation of the wafer or because a wafer flat coincides with and determines the position $x_7$).

The $x_1$-$x_7$ positions which are represented by associated stepper motor steps, are converted by the computer 25 from motor extension steps to x coordinates.

After the preliminary steps of determining the motor extension positions $x_1$ through $x_7$, and converting the position to x coordinates, the six wafer x coordinates $x_2$-$x_7$ are used in the algorithms described below to determine the center coordinate of the wafer and to verify the results. The $x_1$ coordinate associated with the robot arm blade is used for the purpose of setting up the origin of the coordinate system (intersection of x and y axes).

It should be noted that the distance between the sensors is selected so that ordinarily it is not possible for one wafer flat to trigger two sensors. Thus, when the size of the wafers processed in the system 10 is changed it may be necessary to position the sensors farther apart to accommodate a larger wafer without one flat triggering two sensors. Alternatively, when the wafer size is decreased, it may be necessary to position the sensors closer together so that all sensors are activated by the smaller wafer.

5. Determination of Wafer Center Using Moving Blade Coordinates

The following discussion regarding calculating the center position of the wafer 15 on blade 31 describes the presently preferred approaches and, where applicable, alternatives. Ease of computation and accuracy are the primary, but conflicting requirements here. Basically, the x coordinate ($x_c$) of the wafer's center is determined by approximation, and is used in computing the corresponding y center coordinate ($y_c$).

(a) Determination of x Coordinate Referring to FIG. 6, the individual midpoints $M_1$, $M_2$ and $M_3$ defined by the respective pairs of data points $x_3$ and $x_5$, $x_2$ and $x_6$, and $x_4$ and $x_7$ can be used to approximate the x coordinate of the center point of the wafer 15. That is, the center point is approximated by $$M_1 = (x_3 + x_5)/2 \text{ or} \tag{1}$$

$$M_2 = (x_2 + x_6)/2 \text{ or} \tag{2}$$

$$M_3 = (x_4 + x_7)/2 \tag{3}$$

Figure 7:
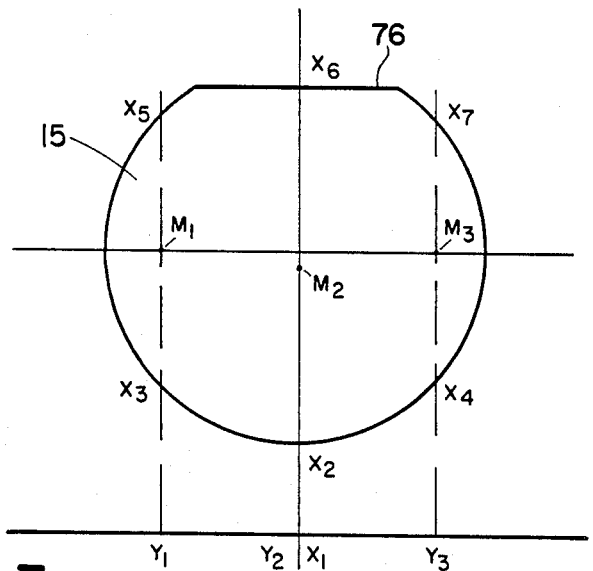
FIG. 7 schematically depicts a wafer having trailing edge flat which coincides with the center sensor.

However, from experience we have discovered that these individual midpoints typically vary by small values. Because the x midpoint coordinate is used to compute the y coordinate, the x coordinate should be as accurate as possible to reduce error in the computed y coordinate. Preferably, then, the midpoint is computed as the average of all three midpoints:

$$\begin{aligned} M_{1,2,3} &= (M_1 + M_2 + M_3)/3 \\ &= (x_2 + x_3 + x_4 + x_5 + x_6 + x_7)/6. \end{aligned} \tag{4}$$

Where one of the six data points $x_2$-$x_7$ coincides with a flat, the associated data point or the associated two data points are not used in the x midpoint coordinate computation. However, the remaining four or five data points provide sufficiently accurate approximation of the $x_c$. For example, FIG. 7 illustrates the situation in which the middle trailing data point $x_6$ coincides with (is defined by) the wafer flat 76. In the event the computer is unable to determine which data point is triggered by the flat, both are disregarded. Thus, in this case, $x_2$ and $x_6$ associated with $M_2$ would not be used. Instead the four data points associated with $M_1$ and $M_3$ are used to provide the computed x midpoint coordinate:

$$\begin{aligned} M_{1,3} &= (M_1 + M_3)/2 \\ &= (x_3 + x_4 + x_5 + x_7)/4. \end{aligned} \tag{5}$$

Alternatively, where the two data points are distinguishable, the "good" point is used. Thus, in our example, the leading edge data point $x_2$ is included in the calculation to provide a five data point average:

$$M_{1,3} = (x_2 + x_3 + x_4 + x_5 + x_7)/5 \tag{6}$$

(b) Determination of y Center Coordinate from R

Next, it is desirable to compute the y coordinate of the wafer midpoint using a fast, yet accurate computational scheme. There are several ways to compute $y_c$ which satisfy the dual requirements of speed and accuracy.

One approach is to calculate the radius R of the wafer 15 and use calculated R to compute $y_c$.

One approach for preliminarily determining R involves simply computing the average of the two trigger points $x_2$ and $x_6$ of the middle sensor 62:

$$R = M_2 = (x_2 + x_6)/2 \tag{7}$$

Referring to FIG. 7, equatron (6) can be used if a flat such as 76 is positioned at the left or right side of the wafer 15 but not if the wafer flat coincides with either of the two middle trigger points $x_2$ and $x_6$. This approach is very simple and fast but may provide less accuracy than is desired in determining R and, subsequently, $y_c$.

Figure 8:
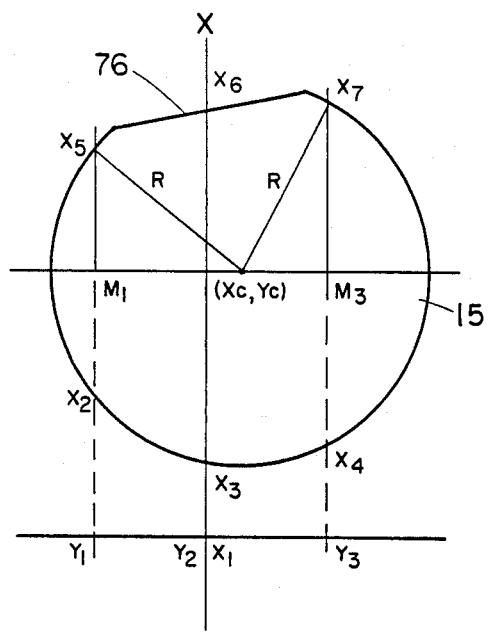
FIGS. 8, 9 and 10 schematically depict the geometric relationships used to determine the wafer center point when a wafer flat coincides with the left, right or middle sensor, respectively.

A second approach for preliminarily determing R provides a more theoretically accurate value of R, but involves somewhat more calculation complexity and computer time. However, the increased complexity is not a particular hindrance for the fast processors and computers which are available today. Because of the increased accuracy, this second approach is preferred. Referring to FIG. 8, this alternative approach to R is based upon the geometric construction of right triangles having a hypotenuse of length R and bases coincident with the y axis. This approach is applicable if a wafer flat 76 coincides with one of the center trigger points, but not if the flat coincides with an outer trigger point. Application of Pythagorean theorem to the two right triangles shown in FIG. 8 provides:

$$R^2 = (y_c - y_1)^2 + (x_2 - x_5)^2/4 \tag{8}$$

$$R^2 = (y_c - y_3)^2 + (x_4 - x_7)^2/4. \tag{9}$$

Solving equations (8) and (9) simultaneously provides:

$$R^2 = ([(y_1 - y_3)^2 + (D_1^2 + D_3^2)/2] - D_1^2 D_3^2/4)/4(y_1 - y_3)^2, \tag{10}$$

where
$D_1 = x_2 - x_5$ and
$D_3 = x_4 - x_7$.

Solution equation (10) contains no approximation except some truncation error at the end if floating point decimals are used, when converting from floating point to integers.

The y coordinate $y_c$ of the wafer midpoint is then obtained by substituting the value of R obtained from one of the above methods—preferably from equation (10)—into either equation (8) or (9).

Figure 9:
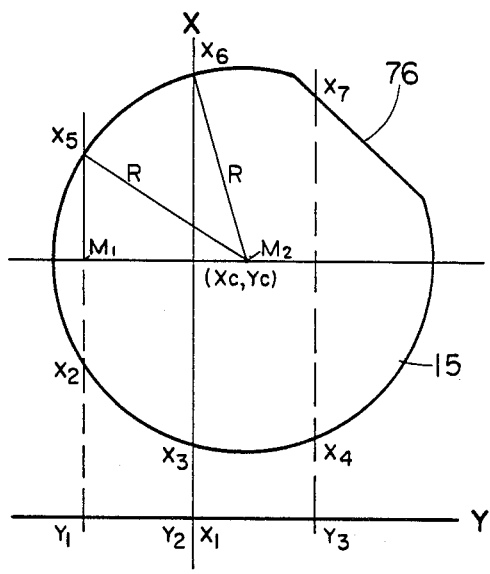
Figure 10:
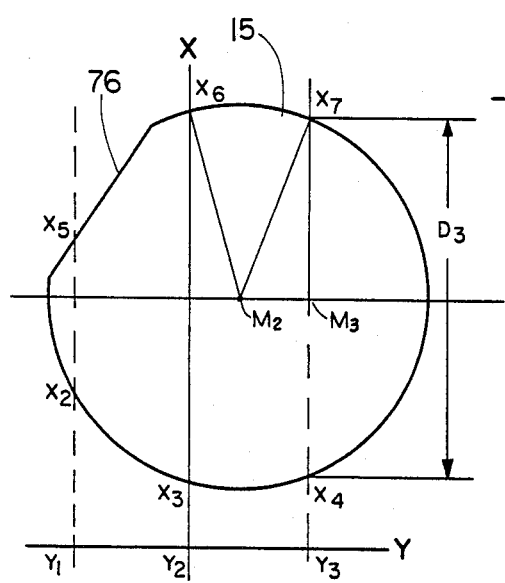

Alternatively, and referring to FIGS. 9 and 10, when the wafer flat coincides with one of the right side trigger points associated with $M_3$ (FIG. 9) or with one of the left side trigger points associated with $M_1$ (FIG. 10) equations (7) and (8) can be used to compute R.

(c) Direct Computation of y Coordinate Midpoint, $y_c$

The presently preferred approach for computing $y_c$ is also based upon the geometrical relationships depicted in FIGS. 8-10, but bypasses the intermediate computation of R by solving the associated Pythagorean equations for $y_c$. Again, three sets of equations are derived depending upon whether the left, middle or right sensor detects a flat (if no flat is detected, any of these sets of equations can be used to find $y_c$). In each case, the two equations are solved simultaneously for $y_c$.

(1) Wafer Flat Detected by Middle Sensor

If a wafer flat is detected by the middle sensor 62, the associated data trigger points for that sensor are discarded and $y_c$ is computed simply by subtracting equation (9) from (8):

$$y_c = \frac{((x_2 - x_5)/2)^2 + y_1^2 - ((x_4 - x_7)/2)^2 - y_3}{2(y_1 - y_3)}. \tag{11}$$

(2) Wafer Flat Detected by Right Sensor

Referring to FIG. 9, when the right sensor 63 triggers on a flat, the two data points for $M_3$ are discarded and the left and middle data points associated with $M_1$ and $M_2$, respectively, are used to derive the following equations:

$$R^2 = (D_1/2)^2 + (y_1 - y_c)^2 \tag{12}$$

$$R^2 = (D_2/2)^2 + (y_c)^2 \tag{13}$$

where
$D_1 = x_2 - x_5$ and
$D_2 = x_3 - x_6$.

Solving these two equations simultaneously provides:

$$y_c = \frac{y_1^2 + (D_1/2)^2 - (D_2/2)^2}{2y_1}. \tag{14}$$

(3) Wafer Flat Detected by Left Sensor

Referring to FIG. 10, when the wafer flat is detected by the left sensor 61, the data points associated with the middle and right sensors, $M_2$ and $M_3$, respectively, provide the following two equations:

$$R^2 = (D_3/2)^2 + (y_3 - y_c)^2 \tag{15}$$

$$R^2 = (D_2/2)^2 + (y_c)^2. \tag{16}$$

Solving these two equations simultaneously provides:

$$y_c = \frac{y_3^2 + (D_3/2)^2 - (D_2/2)^2}{2y_3}. \tag{17}$$

As mentioned, if no flat is detected any one of the above three approaches can be used to compute $y_c$ directly.

This direct method is preferred for it eliminates the intermediate computation of radius, R, and consequently eliminates the error associated with computing the radius. Also, the computation is shorter and faster.

6. Comparison to Least-Squares Approximation

Figure 11:
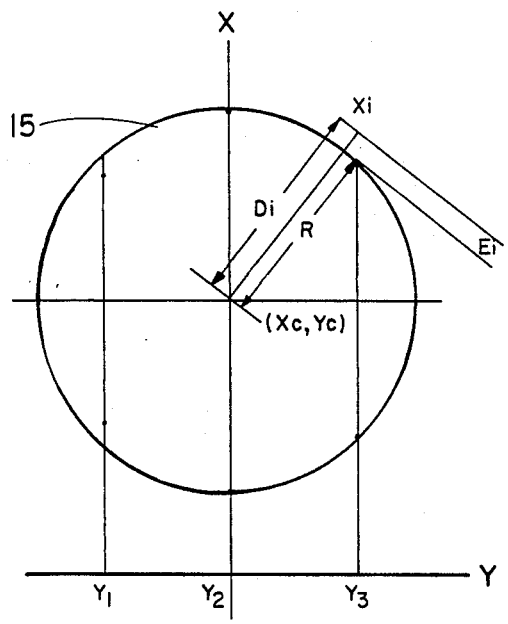
FIG. 11 schematically depicts a geometric relationship used for applying the least squares approximation approach.

The speed and accuracy of the above approach for determining $x_c$, then calculating $y_c$ directly from $x_c$ is perhaps best evidenced by way of comparison to other, rigorous approaches such as the least-squares approximation. Referring to FIG. 11, the center of the wafer is $(x_c,y_c)$. For each of the six detected points or positions $x_i$ ($i=2$-$7$), there is an associated distance $D_i$ from $(x_i,y_i)$ to the center:

$$D_i = \text{sqrt}\ ((x_i-x_c)^2+(y_i-y_c)^2). \tag{18}$$

Assuming a perfect radius, R, the error between $D_i$ and R is:

$$E_i = D_i - R. \tag{19}$$

Using the least-squares method, equation (18) can be solved from:

$$\text{SUM}\ E_i^2 = \text{SUM}\ (D_i-R)^2 \tag{20}$$

where SUM stands for the summation notation, and $i=2,\ldots,7$.

By taking partial derivatives with respect to $x_c$, $y_c$ and R, and equating the derivatives to zero, one obtains three nonlinear equations. Since there are square root expressions in each equations, there is no direct method to find the solution. However, numerical iteration can be used for finding the root.

Surprisingly, we have found that the above-discussed preferred method of calculating $(x_c,y_c)$ provides very accurate answers, with the result that there is no need to use least squares or other time consuming and/or iterative techniques.

7. Rotation of Coordinate Axis

Figure 12:
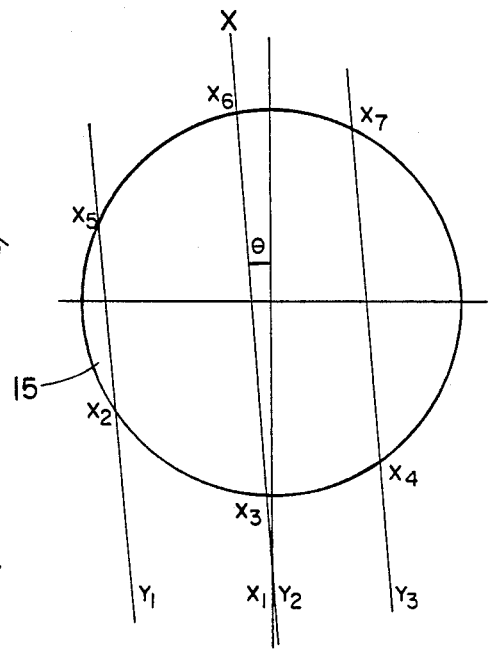
FIG. 12 depicts the non-orthogonal coordinate system which applies when, the robot arm moves at an angle $\theta$ to the axis of the sensor.
Figure 13:
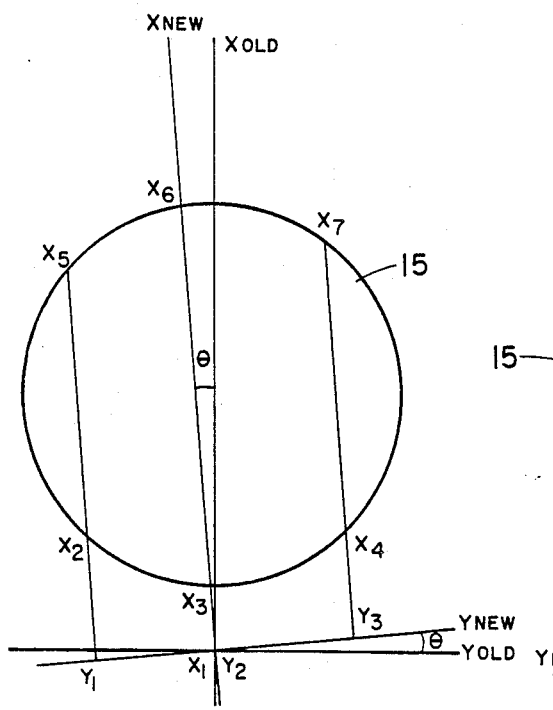
FIGS. 13 and 14 depict, respectively, the coordinate axes rotation and resulting coordinate definition of the trigger points.

The above computational approaches apply when the robot arm 31 moves in a straight line perpendicular to the line connecting the sensors, i.e., to the y axis. When the robot arm 31 does not move perpendicular to the sensors' axis, but at an angle $\theta$, the non-orthogonal coordinate system of FIG. 12 applies. While there are a number of ways to compute the wafer center for this situation, a convenient, easy approach is to assume the coordinate axes are still orthogonal and rotate both axes by $\theta$ so that the y axis coincides with the middle sensor's trace, as in FIG. 13.

Figure 14:
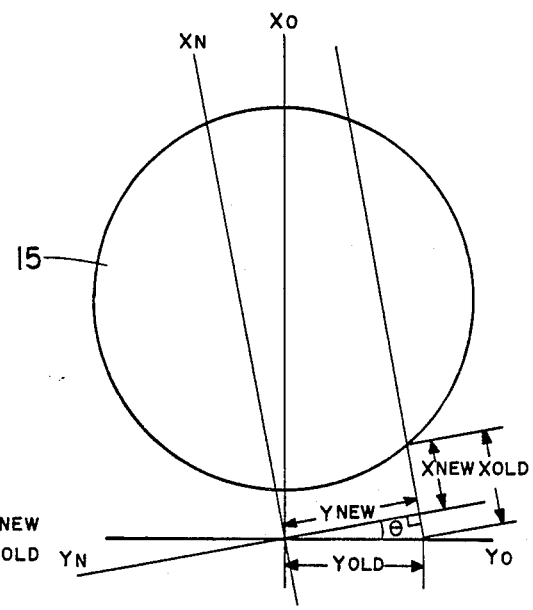

After the rotation, the coordinate of each point is changed. Referring to FIG. 14, this rotation is slightly different from the standard rotation where one knows the coordinate of the points in the old coordinate system. Here, as indicated by the labels "old x" and "old y", the known value of each point is not the coordinate of that point. Thus, initially one lets $y_o=$ old y, $y_n=$ new y; and $x_o=$ old x, $x_n=$ new x.

From the new diagram-, one obtains:

$$x_n = x_o + y_o \sin\theta \tag{21}$$

$$y_n = y_o \cos\theta, \tag{22}$$

or $$\begin{pmatrix} x_n \\ y_n \end{pmatrix} = \begin{pmatrix} 1 & \sin\theta \\ 0 & \cos\theta \end{pmatrix} \begin{pmatrix} x_o \\ y_o \end{pmatrix} \tag{23}$$

If $\theta$ is zero, there is no rotation.
Since $\theta$ is very small in practice, we can simplify it by $$\begin{pmatrix} x_n \\ y_n \end{pmatrix} = \begin{pmatrix} 1 & \theta \\ 0 & 1 \end{pmatrix} \begin{pmatrix} x_o \\ y_o \end{pmatrix} \tag{24}$$

To reverse the computation, we compute $$\begin{pmatrix} x_o \\ y_o \end{pmatrix} = \begin{pmatrix} 1 & \sin\theta \\ 0 & \cos\theta \end{pmatrix} \begin{pmatrix} x_n \\ y_n \end{pmatrix} \tag{25}$$

$$= \begin{pmatrix} 1 & -\tan\theta \\ 0 & \sec\theta \end{pmatrix} \begin{pmatrix} x_n \\ y_n \end{pmatrix} \tag{26}$$

In small angle approximation $$\begin{pmatrix} x_o \\ y_o \end{pmatrix} = \begin{pmatrix} 1 & -\theta \\ 0 & 1 \end{pmatrix} \begin{pmatrix} x_n \\ y_n \end{pmatrix} \tag{27}$$

8. Prototype Program

The software for the above method has been written in for easy implementation. The program description as well as the source code of our present prototype program which has been developed for the preferred computation of $x_c$ and direct computation of $y_c$ from $x_c$ are listed in Appendix 1. This program is a working prototype which is given by way of example. Those of skill in the art will readily develop other programs for this and other computers based upon the above description of the system and method. The following section discusses the practical problems we encountered in using the prototype program and the means to solve them.

9. Sample Data and Analysis

Input data comes in several forms. As shown in Table 1, in most situations, the data is input to computer 25 as seven data pairs. As discussed previously, the signal is the current status of the sensors. Each bit represents a sensor. If the bit is 1, the corresponding sensor is blocked by the wafer; otherwise, it is not blocked. If a bit changes from 0 to 1, the leading edge of the wafer is detected. A bit stays at 1 until it is unblocked by the wafer (the signal changes from 1 to 0). The middle sensor 62 is blocked for te longest length. In Table 1, each number to the left of the signal is the number of steps the motor has moved at each triggering state of the sensors. The numbers decrease in magnitude because, as the robot brings in the wafer, it is retracting arm 31, so the amount of extension is actually decreasing. Among the seven data pairs of Table 1, the first data is not triggered on the wafer, but on the blade of the robot arm. This point is the origin of our two coordinate space coordinate system, as mentioned previously, and the remaining data are used to compute the center of the wafer. With the signals, the computer 25 can identify the data triggered by the same sensor. It simply looks at bit column under the signal, as bit goes from 0 to 1 and from 1 to 0, and records this information which is needed to apply the Center Finder algorithms.

Six or seven entries are the most common type of input. It is very rare but not impossible that two sensors will trigger on a wafer in the same time. Table 2 illustrates this rare occurrence. Here, the two side sensors were unblocked (but not blocked) at the same time. Since this is a good set of input data, the computer does not reject it. There are several ways to handle this data. One can build more complicated algorithms or computation routines to process variable lengths of input, or one can adjust the data at the input checking stage so that length is not a concern. For simplicity, we chose the second method. For example, using the leading edge triggering of the wafer, a symmetric pattern is created, and the data for the two sensors triggering at the same time are duplicated. This is possible because the signals are not involved in the computation; they only help to identify the data. Table 3 is the result of this adjustment of Table 2. The computational results are equally as good as the data of Table 1.

Table 4 depicts data for the situation when two side sensors triggering simultaneously at both the leading edge and trailing edge. In theory, this occurrence is possible when the sensors are perfectly aligned and spaced. To handle it, one simply duplicates the data when the two sensors trigger at the same time and adds a signal to it. Table 5 is the resulting modified form of Table 4. Another advantage in modifying the input at this stage is that this set of data can be checked precisely like unmodified input data.

During the process of testing, the input data may exhibit some vibrations. For example, see the data of Table 6. This is a mechanical problem which typically does not occur. However, if it does happen, the software should be able to recognize the problem and compensate to extract the valid data from the input. This recognition and compensation is provided as follows: if two consecutive signals repeat a few times, the valid data is recovered by removing the subsequent data with repeated signals. Table 7 is the recovered case of Table 6.

TABLE 1

| Motor Extension | Signal |
|---|---|
| 3461 | 000 |
| 3462 | 010 |
| 3139 | 011 |
| 3066 | 111 |
| 1780 | 011 |
| 1761 | 010 |
| 1481 | 000 |

TABLE 2

| Motor Extension | Signal |
|---|---|
| 3524 | 000 |
| 3457 | 010 |
| 3120 | 011 |
| 3075 | 111 |
| 1775 | 010 |
| 1488 | 000 |

TABLE 3

| Motor Extension | Signal |
|---|---|
| 3524 | 000 |
| 3457 | 010 |
| 3120 | 011 |
| 3075 | 111 |
| 1775 | 011 |
| 1775 | 010 |
| 1488 | 000 |

TABLE 4

| Motor Extension | Signal |
|---|---|
| 3503 | 000 |
| 3382 | 010 |
| 3003 | 111 |
| 1708 | 010 |
| 1419 | 000 |

TABLE 5

| Motor Extension | Signal |
|---|---|
| 3503 | 000 |
| 3382 | 010 |
| 3003 | 011 |
| 3003 | 111 |
| 1708 | 011 |
| 1708 | 010 |
| 1419 | 000 |

TABLE 6

| Motor Extension | Signal |
|---|---|
| 3536 | 000 |
| 3476 | 010 |
| 3131 | 011 |
| 3095 | 111 |
| 1794 | 110 |
| 1781 | 010 |
| 1780 | 110 |
| 1779 | 010 |
| 1501 | 000 |

TABLE 7

| Motor Extension | Signal |
|---|---|
| 3506 | 000 |
| 3476 | 010 |
| 3131 | 011 |
| 3095 | 111 |
| 1794 | 110 |
| 1781 | 010 |
| 1501 | 000 |

10. Wafers with Two Flats

The following procedure provides the center position of a wafer which has two flats, one major and one minor.

1. The minor flat is ignored, and the center and radius are computed using all points on the edge except the major flat, which can be found by using the FlatDetec() in CFI.C. (Appendix 1.)

2. After calculating the radii and computing the average, the maximum difference between the average and the distance from each point to the center are calculated. The point having the maximum difference with the average is located on the minor flat. Since all four points are good points, the average is weighted toward the good points.

3. Substitute the four remaining identified good points into the standard equation for a circle and simultaneously solve this system of equations for the center.

APPENDIX 1

Program Description

The highest level routine for this module is ComputeCFI, which coordinates other lower level routines to perform some specific tasks:

1. InitTables()
   This routine is defined in EXTTABLE.C module. It establishes the translation tables for data convesion from motor extension to space coordinate.

2. CheckInputData()
   This routine checks the validity of input data and signals. If the data is in a reasonable range, and signals are in expected order, this routine returns the array index where the first valid signal is present. This way, any noise inputted before the data transfer are not considered. If no valid data found, it returns a error flag and this routine terminates.

3. IdentifyPts()
   There are six triggered points on the wafer, but they are not read in in any particular order so we need to identify which sensor triggered which data. This is useful since we need to find the distance between the points triggered by the same sensor.

4. AlignYaxis()
   Ideally, the three sensor should locate on a straight line perpendicular to the motion of the robot arm. But after sampling some input, we see that the three sensors are not in a straight line. While this problem can be easily adjusted in hardware, I found it is necessary and easier to build a simple routine to align the three points so that their data are correct and the accuracy of the result is improved.

5. DataConvert()
   The data in aCFIdata is in motor coordinate space, that is in number of steps that motor moved, yet the distance between the sensors are in space coordinate (inch x 1000 scale) so we need to translate the motor coordinate to space coordinate. The actual translation is done by routines in another module called EXTTABLE.C which is a table look up and linear interpolation module. A list of the source code for this module is in Appendix II. If one of the data is out of range, a error flag will be returned and the program terminates.

6. RotateAxis(), RotateBack()
   All computations are based on the assumption that robot arm moves in a straight line perpendicular the sensors. But if this is not the case, we can rotate the axis by the angle the robot arm deviated and perform the computation, then rotate the axis back to the original after the computation. Additional hardware is needed for the robot to know whether its arm is moving perpendicular to the sensors.

7. ZeroCoord()
   Before the actual computation starts, we must set up a coordinate axis. We make the middle sensor the zero of Y axis and the first valid data as the zero for X axis.

8. CFI_X_Coord(), CFI_Y_Coord()
   These two routines compute the center of X and Y of for the wafer. The algorithms have been discussed in the preceding sections. The return values are in the coordinate space we just defined.

9. ResultEvaluation()
   In order to assure the accuracy of the result, a self-checking system must be built in, so the calling routine should not use the value of center until the ComputeCFI() returns a valid flag. For a more detailed description of the ResultEvaluation() routine, see next section.

10. ScreenDisplay()

This routine prints out all the data from input to output in the CFI.C module. This is useful for analyzing the data and their accuracy. The module will work without it. Two pages of testing results are included in Appendix III.

```c
/******cfi.h   02072486
 * The constants of cfi.c
 */
#define START_VAL      3400    /* The check points */
#define END_VAL        1250
#define ERR_TOL          50    /* To be determined */
#define ALLOWED_ERR      20    /* acceptable data variation */
#define RADERRTOL        30    /* radius error tolerance */
#define VALIDCTR          1    /* flag of valid data */
#define MIN_GOOD_PTS      3    /* the minimum good points on the wafer */
#define MAX_DEV        0.26    /* 15 degree is the max deviation allowed */
define MAX_BAS_VAR      20    /* maximum robot extension variation */ define UR               0    /* The point on the wafer: UR: upper right point */
define LR               1
#define UM               2
#define LM               3
#define UL               4
define LL               5 define MAX_WF_PTS       6

/*
#define X                0
#define Y                1
*/
/* sensor names */
#define R                0    /* right, middle, left sensor*/
#define M                1
define L                2 define NUM_SNSR         3 define N_FLAT           0    /* flat flags , input */
define L_FLAT           1
#define R_FLAT           2
define M_FLAT           3 define ONE_FLAT        10
define TWO_FLAT        20 define FALSE            0
define TRUE             1 define LE              11
define TE              12 define DEBUG_HI    0x8000    /* cfi debug code */
define DEBUG_MI    0x4000
#define DEBUG_LO    0x2000
define DEBUG_OF    0x0000 extern unsigned cfiDebugLevel;
/**** end of cfi.h ********/
/*begin cfi.c  07062786
** This module finds the center of the wafer as
** it enters the slot
**/ include "cfi.h"    /* constants of cfi.c */
include "cdata4.h"
#include "cfrsensr.h"

struct Coord_ds { int x;
                  int y;
```

```c
            int flat; /* 0 for no flat */
            int disToCtr;
            }
        aWfEdgePts[6]; /* all points on the wafer edge */ struct FlatInfo_ds{
            int flatBit;    /* 0: no flat, 1: flat */
            int sensor;     /* which sensor detected */
            int location;   /* leading or trailing edge */
            int midPt;      /* the midpoints between the triggered edges */
            } aIDedFlat[3];

double angle=0.0; /* the angle the robot arm deviate from the x axis */
int sensor[]={/* st1 **2792, 0, -2921 */ 2795, 0, -3004}; /* corresponding to R, M, L */
int aIndex[MAX_CFI];      /* array of index used in CheckInputData */
int aRadius[MAX_WF_PTS];  /* holds the radius for each point on the wf */
int aErrMeasure[MAX_WF_PTS];  /* holds boolean value of good or bad pt */
int aCalibAdjust[] ={ 0, 0, 0};  /* Calibration adjust for each sensor */
int alignment[] ={0, 0, 0,0, 0t0};   /* sensors alignment */
int aMaskBit[] ={ 0x80, 0x40, 0x20};       /* mask sensor bits */
int aIDedData[MAX_WF_PTS], wf_Xcoord[MAX_WF_PTS];/* identified, converted */
int flatFlag = 0;                   /* flat signal */
int xC[3];
int x_Center, y_Center;             /* the center computed */
int base;                           /*x coordinate of origin */
int nUsedPts;
int radius = 0; /* the radius of this wafer */
double rotArmL = 11.9; /* inch, rotational radius on WS */
double unitRotAngle = 1.2566; /* 72 degree in radians for one unit of rotation*/
int idealSlotDis = 253; /* The distance between the triggered point on the blade and
                           the first triggered point on the wafer in the ideal
                           case, i.e no extension adjustment is needed */
int cfiDisp = 1;  /* enable display results */
double rotationAdjust = 0; /* the distance between the middle sensor and the
                              WS center int senors axis direction */ unsigned cfiDebugLevel;

double Sqr();
double CenterDevRot();
double ComputeStdDev();
double Deviation();
double CenterDevExt();

FILE *pCFIdgnsf;
char CFIdgnsf[]="CFIdgnsf.dat";

InitServiceCFIerror() /* initialize the CFI error service routines WZ861110
===================== */
{
    if((pCFIdgnsf =fopen(CFIdgnsf, "w")) ==.NULL)
        printf("\007\ncannot open file %s\n", CFIdgnsf);
}

TerminateServCFIerr()  /* close the diagnose record file  WZ861110
======================  */
{
    fclose(pCFIdgnsf);
}

ServiceCFIerror(rtnm, errMsg) /* write all data to file in case of error   WZ861110
==============================  */
char rtnm[], errMsg[];
{
    char comments[200];

fprintf(pCFIdgnsf,"%s %s", rtnm, errMsg);
    printf("Enter Comments to CFIdgnsf.dat\n\n");
```

```c
        scanf("%s", comments);
        fprintf(pCFldgnsf,"%s\n",comments);
        if(getCmnd("DiagnoseRoutine: Continue Abort","ac")=='a'){
           TerminateServCFIerr();
           AbortRsa();
        }
   }

ComputeCFI(pdRbtExt, pdRbtRot)/* This routine computes the center   WZ571186
==============================  of the wafer */
double *pdRbtExt, *pdRbtRot;
{
     int startPt = 0;
     int i;
     int x, y;
     int p1, p2, p3,p4;
     static unsigned event=0;

fprintf(pCFldgnsf, "Event [%u]\n ", ++event);

fprintf(pCFldgnsf, "ComputeCFI...Number of Inputs[%d]\n",nCFIdata);
     if(cfIDebugLevel & DEBUG_HI) printf("ComputeCFI...Number of Inputs[%d]\n",nCFIdata);
     for(i=0; i< nCFIdata; i++){
        fprintf(pCFldgnsf, "ComputeCFI...motorPos=%d  CFIsignal=%2X\n", aCFI[i].motorPos, aCFI[i].signal);
        if(cfIDebugLevel & DEBUG_HI)  printf("ComputeCFI...motorPos=%d  CFIsignal=%2X\n", aCFI[i].motorPos, aCFI[i].signal);
     }
     if(nCFIdata > 10){
        printf("Too many triggered points\n");
        ServiceCFIerror("ComputeCFI", "Too many triggered points\n");
        return ERR;
     }
     if(cfIDebugLevel & DEBUG_HI) printf("before checking input\n");
     if((startPt=CheckInputData())== ERR)
        return ERR;

fprintf(pCFldgnsf, "Pass Input data checking successfully\n");
     if(cfIDebugLevel & DEBUG_HI)  printf("Pass Input data checking successfully\n");

IdentifyPts(startPt);

fprintf(pCFldgnsf, "Pass indentifyPts\n");
     if(cfIDebugLevel & DEBUG_HI)  printf("Pass indentifyPts\n");

AlignYaxis();

if(DataConvert()==ERR)
        return ERR;
     fprintf(pCFldgnsf, "Pass Data convert\n");

if(cfIDebugLevel & DEBUG_HI) printf("before checking input\n");
     if((startPt=CheckInputData())== ERR)
        return ERR;

fprintf(pCFldgnsf, "Pass Input data checking successfully\n");
     if(cfIDebugLevel & DEBUG_HI)  printf("Pass Input data checking successfully\n");

IdentifyPts(startPt);

fprintf(pCFldgnsf, "Pass indentifyPts\n");
     if(cfIDebugLevel & DEBUG_HI)  printf("Pass indentifyPts\n");

AlignYaxis();

if(DataConvert()==ERR)
        return ERR;
     fprintf(pCFldgnsf, "Pass Data convert\n");

base = ZeroCoord(startPt);
     GetCoordOfAllPts();
```

```c
switch(FlatStatus(&flatFlag)){
  case ONE_FLAT:if(cfiDebugLevel & DEBUG_HI) printf("compute center with one flat\n");
              if(Center_XY1(flatFlag, &x_Center, &y_Center)==ERR)
                  return ERR;
              if(cfiDebugLevel & DEBUG_HI) printf("got center\n");
              break;
  case TWO_FLAT:if(cfiDebugLevel & DEBUG_HI) printf("compute center with two flats\n");
              Center_XY2(&x_Center, &y_Center);
              break;
} if(cfiDebugLevel & DEBUG_HI) printf("before evaluation\n");
if(ResultEvaluation(x_Center, y_Center) != VALIDCTR){
   printf("\007ComputeCF1 -- Computation result shows input data invalid");
   ServiceCFIerror("ComputeCF1", "Computation result shows input data invalid\n");
   return ERR;
}
if(cfiDebugLevel & DEBUG_HI) printf("after evaluation\n");
*pdRbtExt = Center-DevExt();
if(cfiDebugLevel & DEBUG_HI) printf("after extdev\n");
*pdRbtRot = rotationAdjust + Center-DevRot();
fprintf(pCFIdgnsf, "\nExtAdj=%f  RotAdj=%f\n", *pdRbtExt, *pdRbtRot);
   if(cfiDebugLevel & DEBUG_HI) printf("\nExtAdj=%f  RotAdj=%f\n", *pdRbtExt, *pdRbtRot);

if(cfiDisp){
if(cfiDebugLevel & DEBUG_HI) printf("right before screen display\n");
ScreenDisplay(*pdRbtRot, *pdRbtExt);    /* optional */ return VALIDCTR;
}

ZeroCoord(sP) /* return the x coordinate of origin for     WZ 070786
===========    the reference space*/
int sP;
{
   return(TrigMotorEx2Dist(aCFI[sP].motorPos,M));
}

IdentifyPts(startPt) /* Identify the points on the wafer    WZ070286
=============== put results in aIDedData */
int startPt;
{
    int i, j, k =0;
    int oldSignal;

for(j=0; j < NUM_SNSR; j++){
        oldSignal = aCFI[startPt].signal & aMaskBit[j];
        for(i=startPt+1; i< startPt+7; i++){
            if (oldSignal == (aCFI[i].signal & aMaskBit[j]) ) continue;
            aIDedData[k++] = aCFI[i].motorPos;
            oldSignal = aCFI[i].signal & aMaskBit[j];
        }
    }
}

AlignYaxis() /* Align the sensor positions   WZ070286
=============*/
{
    int i;

alignment[1] = alignment[0];
    alignment[3] = alignment[2];
    alignment[5] = alignment[4];
```

```c
    for(i=0; i < MAX_LE_PTS; i++){
        alDedData[i] = alDedData[i] + alignment[i];
    }
}

DataConvert()/* convert data for motor coordinate    WZ062786
============  to space coordinate (unit = inch x 1000)*/
{
    int i,j=0;
    int limit = 6;
    int badData = 0;

for(i=0; i<limit; i++){
        if(i%2 == 0)
            ut_Xcoord[i] = LdEgMotorEx2Dist(alDedData[i],j); /* leading edge */
        else
            ut_Xcoord[i] = TrlEgMotorEx2Dist(alDedData[i],j++);/* trailing edge */
        if (ut_Xcoord[i] == ERR){
            badData = 1;
            break;
        }
    }
    return ((badData)? ERR : 0);
}

Center_XY1(fFlag, pXc, pYc)/* return pointers to the center   WZ060386
======================*/
int fFlag;
int *pXc, *pYc;
{ if((*pXc = CFI_X_Coord(fFlag))==ERR)
        return ERR;

if((*pYc = CFI_Y_Coord(fFlag))==ERR)
        return ERR;
}

CFI_X_Coord(flatFlag) /* returns the x coordinate     WZ062786
=================== of the center with the origin of the
                    the coordinate at the blade */
int flatFlag;
{
    int xc;

switch(flatFlag){
        case N_FLAT:
            xc = (xC[R]+xC[M]+xC[L])/3;
            break;
        case L_FLAT:
            xc = (xC[M]+xC[R])/2;
            SetFlatFlag(L);

break;
        case R_FLAT:
            xc = (xC[L]+xC[M])/2;
            SetFlatFlag(R);

break;
        case Y_FLAT:
            xc = (xC[R]+xC[L])/2;
            SetFlatFlag(M);

break;
        default:
            return ERR;
    }
    return (xc);
}
```

```
SetFlatFlag(sensorNum)/* WZ031486
====================*/
int sensorNum;
{
    aWfEdgePts[sensorNum*2].flat = TRUE;
    aWfEdgePts[sensorNum*2+1].flat = TRUE;
}

CFl_Y_Coord(fFlat) /* Find the y coordinate of the center  WZ070686
===============*/
int fFlat;
{
    switch(fFlat){
        case N_FLAT:
        case R_FLAT: return(CenterYRF());
        case L_FLAT: return(CenterYLF());
        case M_FLAT: return(CenterYMF());
        default: return ERR;
    }
}

CenterYMF()/* Find Center of y coordinate with    WZ070686
==========  a flat detected by the middle sensor */
{
    double d1, d3;
    double numerator, denominator;

d3 = Sqr((double)(aWfEdgePts[UR].x)-aWfEdgePts[LR].x + CalibAdjust('R'))/4;
    d1 = Sqr((double)(aWfEdgePts[UL].x)-aWfEdgePts[LL].x + CalibAdjust('L'))/4;

numerator = d1 - d3 + Sqr((double)aWfEdgePts[UL].y) - Sqr((double)aWfEdgePts[UR].y);
    denominator = 2*(aWfEdgePts[UL].y - aWfEdgePts[UR].y);

return((int)(numerator/denominator));
}

CenterYRF() /* Find Center of y coordinate with   WZ070686
==========   a flat detected by the right sensor */
{
    double d1, d2;

d1 = Sqr((double)(aWfEdgePts[UL].x)-aWfEdgePts[LL].x + CalibAdjust('L'))/4;
    d2 = Sqr((double)(aWfEdgePts[UM].x)-aWfEdgePts[LM].x + CalibAdjust('M'))/4;
    if(cfDebugLevel & DEBUG_MI) printf("centerYRF... d1=%f, d2= %f, deno = %d\n", d1, d2, aWfEdgePts[UL].y);
    return((int)((d1 - d2 + Sqr((double)aWfEdgePts[UL].y))/(2*aWfEdgePts[UL].y)));
}

CenterYLF() /* Find Center of y coordinate with   WZ070686
==========   a flat detected by the left sensor */
{
    double d2, d3;

d2 = Sqr((double)(aWfEdgePts[UM].x) - aWfEdgePts[LM].x + CalibAdjust('M'))/4;
    d3 = Sqr((double)(aWfEdgePts[UR].x) - aWfEdgePts[LR].x + CalibAdjust('R'))/4;

return((int)((d3 - d2 + Sqr((double)aWfEdgePts[UR].y))/(2* aWfEdgePts[UR].y)));
}

FlatStatus(pFlatFlag)/* determines the number of flats  WZ069386
====================*/
int *pFlatFlag;
{
    if(cfDebugLevel & DEBUG_MI)  printf("in FlatStatus\n");
    if(( *pFlatFlag = FlatDetec(ERR_TOL)) != ERR){
        fprintf(pCFldgnsf, "This wafer has less than one flat\n");
        if(cfDebugLevel & DEBUG_MI) printf("This wafer has less than one flat\n");
        return ONE_FLAT;
    }
```

```
    else{
        fprintf(pCFldgnsf, "This wafer is has two flats\n");
        if(cfiDebugLevel & DEBUG_MI) printf("This wafer is has two flats\n");
        return TWO_FLAT;
    }
}

FlatDetec(errTol) /* locate the flat on the wafer    WZ062986
=========== */
int errTol;
{
    if(cfiDebugLevel & DEBUG_MI) printf("FlatDetec... errTol = %d\n", errTol);
    if( (Diff(xC[L], xC[M]) <= errTol) &&
        ((Diff(xC[L], xC[R]) > errTol) ||
         (Diff(xC[M], xC[R]) > errTol))){
          return R_FLAT;
    }
    if(cfiDebugLevel & DEBUG_MI) printf("after right flat check\n");

if( (Diff(xC[L], xC[R]) <= errTol) &&
        ((Diff(xC[L], xC[M]) > errTol) ||
         (Diff(xC[R], xC[M]) > errTol))) {
          return M_FLAT;
    }
    if(cfiDebugLevel & DEBUG_MI) printf("after middle flat check\n");

if( (Diff(xC[M], xC[R]) <= errTol) &&
        ((Diff(xC[M], xC[L]) > errTol) ||
         (Diff(xC[R], xC[L]) > errTol))){
          return L_FLAT;
    } if(cfiDebugLevel & DEBUG_MI) printf("after left flat check\n");
    if( (Diff(xC[L], xC[M]) <= errTol) &&
        ((Diff(xC[L], xC[R]) <= errTol) &&
         (Diff(xC[M], xC[L]) <= errTol))){
          return N_FLAT;
    }
    if(cfiDebugLevel & DEBUG_MI) printf("after checker all, and before return\n");
    return ERR;
}

Diff(x, y) /* the difference between x, y    WZ063086
=========== */
int x, y;
{
    return(abs(x-y));
} double Sqr(x) /*   return the square of x  .WZ062986
============= */
double x;
{
    return(x*x);
}

GetCoordOfAllPts()/*                       WZ070386
=================*/
{
    int i, j=0;

fprintf(pCFldgnsf, "The coordinate of all available points on wafer\n");
    for(i=0; i<6; i++){
        auEdgePts[i].x = wf_Xcoord[i];
        fprintf(pCFldgnsf, "X%1d=%d\n", i+1, wf_Xcoord[i]);
```

```
        aWfEdgePts[i].y = sensor[j];
        fprintf(pCFldgnsf, "Y%1d=%d\n", i+1, sensor[j]);
        aWfEdgePts[i].flat = FALSE;
        aWfEdgePts[i].disToCtr = 0;
        if((i%2)!=0)
          j++;
     }
     xC[R] = (aWfEdgePts[UR].x+aWfEdgePts[LR].x)/2;
     xC[M] = (aWfEdgePts[UM].x+aWfEdgePts[LM].x)/2;
     xC[L] = (aWfEdgePts[UL].x+aWfEdgePts[LL].x)/2;

for(i = 0; i < 3; i++){
        aDedFlat[i].flatBit = FALSE;
        aDedFlat[i].midPt = xC[i];
        fprintf(pCFldgnsf, "MidPoint%1d=%d\n", i+1, xC[i]);
     }

}

}

RotateAxis(angle)/* rotate axis by the angle    WZ072286
=================*/
double angle;
{
    int i, j=0;

for(i=0; i<MAX_WF_PTS; i++){
/*      printf("aWfEdge[%d].x =%d, aWfEdgePts[%d].x+sensor[%d]*sin(%.3G)=%d\n",
        i,aWfEdgePts[i].x,i,j, angle, aWfEdgePts[i].x+sensor[j]*sin(angle));
*/      aWfEdgePts[i].x =aWfEdgePts[i].x+sensor[j]*sin(angle);
        /***printf("aWfEdgePts[%d].y=%d, cos(%.3G)=%.3G\n",i, aWfEdgePts[i].y,
        angle, cos(angle));
***/    aWfEdgePts[i].y = sensor[j]*cos(angle);
/**     printf("coverted aWfEdgePts[%d].y=%d\n",i, aWfEdgePts[i].y);
**/     if((i%2)!=0)
           j++;
    }
}

RotateBack(angle)/* reverse the rotation    WZ072286
=================*/
double angle;
{
    int i;

for(i=0; i<MAX_WF_PTS; i++){
        aWfEdgePts[i].x = aWfEdgePts[i].x - (aWfEdgePts[i].y)*tan(angle);
        aWfEdgePts[i].y = ((double)(aWfEdgePts[i].y))/cos(angle);
    }

/* rotate the center coordinate */
    x_Center = x_Center - y_Center*tan(angle);
    y_Center = y_Center/cos(angle);
}

PrintCoordOfAllPts()/* print out coordinates of all    WZ070286
===================      found points */
{
    printf("The Center of the wafer(%d,%d)\n", x_Center, y_Center);
    printf("\n");
    printf("upper  left(%5d,%5d)   ", aWfEdgePts[UL].x, aWfEdgePts[UL].y);
    printf("lower  left(%5d,%5d)\n", aWfEdgePts[LL].x, aWfEdgePts[LL].y);
    printf("upper middle(%5d,%5d)   ", aWfEdgePts[UM].x, aWfEdgePts[UM].y);
    printf("lower middle(%5d,%5d)\n", aWfEdgePts[LM].x, aWfEdgePts[LM].y);
    printf("upper right(%5d,%5d)   ", aWfEdgePts[UR].x, aWfEdgePts[UR].y);
    printf("lower right(%5d,%5d)\n", aWfEdgePts[LR].x, aWfEdgePts[LR].y);

}
```

```
CheckInputData() /* check if input data "makes sense" WZ070286
=============== */
{
    int k;

if(DataCorrection(&k)==ERR)
       return ERR;

if(DataVerify(aIndex[k], aIndex[k]+6)==ERR)
       return ERR;

if(SignalVerify(aIndex[k] == ERR)
       return ERR;

return (aIndex[k]);
}

DataCorrection(p) /* WZ071286
=============== */
int *pk;
{
    int  j, k=0, notFoundValidData = 1;
    if(nCFldata > 7) NoiseElim();  /* WZ061117 */
    j = SearchValidSignals();
    notFoundValidData = Search4ElementsEntry(&k, j);

if(notFoundValidData){
       k = 0; notFoundValidData = Search5ElementsEntry(&k, j);
    }
    if(notFoundValidData){
       k = 0; notFoundValidData = Search4ElementsEntry(&k, j);
    }
    if(notFoundValidData){
       k=0; notFoundValidData = VibrationCheck(&k, j);
    }

*pk = k;
    if(notFoundValidData){
        pause("\007DataCorrection------No valid data found!!!");
        return ERR;
    }
    return 0;
}

NoiseElim() /* eliminate noise from the signal  WZ061117
=========== */
{
    int i=0;

while( i++ < nCFldata-1){
        if(abs(aCF[i].motorPos-aCF[i+1].motorPos) < 2) {
            ShiftLeft2(i, nCFldata-1);
            nCFldata -= 2;
        }
    }
}

SearchValidSignals() /* Eliminate noise signals to find valid data WZ070986
==================== */
{
    int i=0, j=0;

do{/* Locate all entries which have signal 0x00 */
       if((aCF[i].signal==0x00) ||
          (aCF[i].signal==0x0)){
          aIndex[j++]=i;
       }
    }while((++i)<nCFldata);
    return j;
```

```
Search6ElementsEntry(pk, j)/* Check to see if there are six triggered points WZ070986
============================   on the wafer */
int *pk, j;
{
    int k;
    int notFound6 = 1;

k =*pk;
    while(notFound6 && (k+1 < j)){
        if((aindex[k+1] - aindex[k]) == 6){
            notFound6 = 0;
            *pk = k;
        }else k++;
    }
    if(notFound6)
        fprintf(pCFldgnst, "No six input data found\n");
    return notFound6;

}

Search5ElementsEntry(pk, j)/* return the result of search WZ070986
============================ */
int *pk, j;
{
    int notFound5 = 1;
    int k;

k = *pk;
    while(notFound5 && (k+1 < j)){
        if((aindex[k+1]-aindex[k]) == 5){
            if(InputAdjusted(aindex[k], 5)){
                nCFldata ++;
                notFound5 = 0;
                *pk = k;break;
            }else k++;
        }else k++;
    } if(notFound5)
        fprintf(pCFldgnst, "No six input data found\n");

return notFound5;
}

Search4ElementsEntry(pk, j)/* the left and right sensors triggered at the same   WZ070986
============================   time in both leading edge and trialing edge of the wafer
                               return the status of search */
int *pk, j;
{
    int notFound4 = 1;
    int k;

k = *pk;
    while(notFound4 && (k+1 < j)){
        if((aindex[k+1]-aindex[k])==4){
            if(InputAdjusted4El(aindex[k], 4)){
                nCFldata += 2;
                notFound4 =0;
                *pk = k;
            }else k++;
        }else k++;
    } if(notFound4)
        fprintf(pCFldgnst, "No four input data found\n");
    return notFound4;
}

VibrationCheck(pk, j)/* WZ070986
==================== */
int *pk, j;
```

```
    {
        int notFound =1;
        int i, nTerm;

k = *pk;
        while(notFound && (k+1 < j)){
            if((aIndex[k+1] - aIndex[k]) > 6){
                printf("\007\007\n The number of data is %d\n", aIndex[k+1]-aIndex[k]);
                if(VisEll-(aIndex[k], aIndex[k+1], &nTerm)){
                    nCFldata = nCFldata - nTerm;
                    notFound = 0; *pk = k; break;
                }else k++;
            } else k++;
        }
        return notFound;
    }

DataVerify(ib, ie)/* WZ070986
====================*/
int ib, ie;
{
    int i,badData = 0;

if((abs(aCFl[ib+1].motorPos - aCFl[ib+2].motorPos) < 100) &&
       (abs(aCFl[ib+1].motorPos - aCFl[ib+3].motorPos) < 100)){
        pause("\007CheckInputData---Too big a flat, Center cannot be found");
        return ERR;
    } if((abs(aCFl[ie].motorPos - aCFl[ib-1].motorPos) < 100) ||
       (abs(aCFl[ie].motorPos - aCFl[ib-2].motorPos) < 100)){
        pause("\007CheckInputdata----Too big a flat, Center cannot be found");
        return ERR;
    } for(i=ib; i<ib+5; i++){
        if(aCFl[i].motorPos<aCFl[i+1].motorPos){
            pause("\007Incorrect data sequence");
            badData = 1;
            break;
        }
    } if(badData)
        return ERR;

return 0;
}

SignalVerify(ib)/* WZ071086
================ */
int ib;
{
    int i, goodWafer;

if (aCFl[ib+3].signal != OxEO){ printf("\007SignalVerify----Bad wafer");
    ServiceCFlerror("SignalVerify", "Three sensors were not all blocked\n");
    return ERR;
    } i = ib;
    goodWafer = 1;
    do{
        if(aCFl[i].signal+Ox10 > aCFl[i+1].signal){
            pause("\007SignalVerify--- Center Finder signals indicate the object on the blade is not a wafer");
            goodWafer = 0;
```

```
        }
    }while(aCFI[++i].signal<0xE0 && goodWafer);

if (!goodWafer)
       return ERR;
    i = ib+3;
    goodWafer = 1;
    do{
        if(aCFI[i].signal-0x10 < aCFI[i+1].signal){
            printf("\037SignalVerify --- Not a good wafer");
            ServiceCFIerror("SignalVerify", "Signal sequence is bad\n");
            goodWafer =0;
        }
    }while(aCFI[++i].signal < 0xC0 && goodWafer);

if (!goodWafer)
       return ERR;
    return 0;
}

InputAdjusted(ib, disp)/* WZ070886
==================== */
int ib;
int disp;
{
    int i;
    int OK = 0;

for(i=0; i<disp-1; i++){
        if((aCFI[ib+i].signal ==0xE0) &&
           (aCFI[ib+i+1].signal == 0x40)){
            ShiftRight(ib+i+1, ib+disp);
            aCFI[ib+i+1].signal = aCFI[ib+i-1].signal;
            aCFI[ib+i+1].motorPos = aCFI[ib+i+2].motorPos + 1;
            OK = 1;
        }
        if((aCFI[ib+i].signal == 0x40) &&
           (aCFI[ib+i+1].signal == 0xE0)){
            ShiftRight(ib+i+1, ib+disp);
            aCFI[ib+i+1].signal = aCFI[ib+i+3].signal;
            aCFI[ib+i+1].motorPos = aCFI[ib+i+2].motorPos + 1;
            OK = 1;
        }
    }
    return OK;
}
InputAdjusted4E(ib, disp) /* input adjust for 4 inputs  WZ070886
========================= */
int ib, disp;
{
    int OK =0;

if((abs(aCFI[ib].motorPos -START_VAL)>150) ||
       (abs(aCFI[ib+disp].motorPos -END_VAL) > 150))
       return OK;

if((aCFI[ib+1].signal == 0x40) &&
       ((aCFI[ib+2].signal == 0xE0) &&
        (aCFI[ib+3].signal == 0x40))){
        aCFI[ib+6].signal = aCFI[ib+4].signal;
        aCFI[ib+6].motorPos = aCFI[ib+4].motorPos;
        aCFI[ib+5].signal = aCFI[ib+3].signal;
        aCFI[ib+5].motorPos = aCFI[ib+3].motorPos;
        aCFI[ib+4].signal = 0x40;
        aCFI[ib+4].motorPos =aCFI[ib+5].motorPos + 1;
        aCFI[ib+3].signal = aCFI[ib+2].signal;
        aCFI[ib+3].motorPos = aCFI[ib+2].motorPos;
        aCFI[ib+2].signal = 0x60;
```

```c
            aCFI[ib-2].motorPos = aCFI[ib+2].motorPos +1;
            OK = 1;
        } return OK;
}

ShiftRight(ib,ie)/* shift the ssegment from   WZ070986
======================== */
int ib, ie;
{
    int i;
    int j;

for (j=ie; j>=ib; j--){
        aCFI[j+1].motorPos = aCFI[j].motorPos;
        aCFI[j+1].signal = aCFI[j].signal;
    }
}

VibElim(ib, ie, nTerm) /* WZ070986
========================== */
int ib, ie, *nTerm;
{
    int i=0,j;
    int OK = 0;
    int length;

length = ie -ib;
    do{
        j=1;
        do{
            if((aCFI[ib+j].signal ==aCFI[ib+j+2].signal) &&
               (aCFI[ib+j+1].signal == aCFI[ib+j+3].signal)){
                ShiftLeft2(ib+j+2, ie);
                ie -= 2;
                *nTerm +=2;
                length -=2;
            } else j++;
        }while(j<(length-2));
    }while((++i)<(length-2));

if(length == 6)
        OK = 1;
    return OK;
}

ShiftLeft2(ib, ie)/* shift left by 2  WZ070986
============= */
int ib, ie;
{
    int i;
    for(i=ib; i< ie-1; i++){
        aCFI[i].signal = aCFI[i+2].signal;
        aCFI[i].motorPos = aCFI[i+2].motorPos;
    }
}

ResultEvaluation(xc, yc)/* determine how good the  WZ070986
================== the result is */
{
    int nGoodPts;

radius = GetRadius(xc, yc, 6);

return(((nUsedPts=GetNGoodPts()) < MIN_GOOD_PTS)? ERR : VALIDCTR);
}
```

```
GetNGoodPts()/* WZ081086
================*/
{
    int i, j= 0;

for(i=0; i < 6; i++){
        if(aUfEdgePts[i].flat == FALSE){
            aErrMeasure[j] = ((abs(radius - aUfEdgePts[i].disToCtr)) <= RADERRTOL ? 1:0);
            aRadius[j] = aUfEdgePts[i].disToCtr;
            j++;
        }
    }
    return j;
}

CalibAdjust(sensorNum)/* adjust calibration     WZ070886
======================= */
char sensorNum;
{
    switch(sensorNum){
        case 'L': return(aCalibAdjust[L]);
        case 'M': return(aCalibAdjust[M]);
        case 'R': return(aCalibAdjust[R]);
        default:
            printf("\007\nCalibrationAdjust--------BAD sensor # %c\n",sensor);
            return ERR;
    }
}

ScreenDisplay(dRbtRot, dRbtExt)/* WZ071586
================ */
double dRbtRot, dRbtExt;
{
    int i;
    int again;

do{
        scr_rowcol(0,0);
        scr_clr();
        printf("              CENTER FINDER DIAGNOSTIC DATA\n");
        printf("              ================================\n");
        printf("\nThe original motor positions        The Converted data\n");
        printf(" Sensor#1   Sensor#2   Sensor#3   Sensor#1   Sensor#2   Sensor#3\n" );
        printf("%3d%10d%10d",aIDedData[UL], aIDedData[UM], aIDedData[UR]);
        printf("%10d%10d%10d\n",uf_Xcoord[UL], uf_Xcoord[UM], uf_Xcoord[UR]);
        printf("%3d%10d%10d", aIDedData[LL], aIDedData[LM], aIDedData[LR]);
        printf("%12d%12d%12d\n\n", uf_Xcoord[LL], uf_Xcoord[LM], uf_Xcoord[LR]);
        printf("    xCenter#1   xCenter#2   xCenter#3\n");
        printf("%12d%12d%12d\n\n", xC[L], xC[M], xC[R]);
        printf("base = %d\n", base);
        PrintFlatStatus();
        PrintCoordOfAllPts();
        printf("The robot extension deviates from the center =%.5G\n", dRbtExt);
        printf("The robot rotation deviates from the center =%.5G\n",dRbtRot);
        printf("\nHit any key to continue.... ");
        getch();
        scr_clrnl(3,23);
        printf("\n");
        PrintRadiuses();
        scr_rowcol(23,0);
        switch(getCmnd("CFIcmnd: P=previousPage Q=quit","pq")){
            case 'p': again = 1; break;
            case 'q': again = 0;
        }
    }while(again);
```

```
PrintFlatStatus()/* UZ031286
==================*/
{
    int i, j=0;

for(i=0; i<6; i++){
        if(aWlEdgePts[i].flat == TRUE){
            PrintEdgeInfo(i);
            j++;
        }
    }
    if(j==0)
        printf("No flat detected\n");
}

PrintEdgeInfo(index)/* UZ031286
==================*/
int index;
{
    char *s, *edge;

switch(index/2){
        case R : s = "right";
                 break;
        case M : s = "middle";
                 break;
        case L : s = "left";
    }
    if(index%2)
        edge = "trailing";
    else
        edge = "leading";

printf("A flat is at %s on %s edge\n", s, edge);
    fprintf(pCFldgnsf, "A flat is at %s on %s edge\n", s, edge);
} double CenterDevExt() /*                         UZ072286
================ Convert the center from space to motor coordinate */
{
    int dl, trl, led;
    int perfectXDist, motorStep;
    int perfectX;
    extern float rbtExtWSV;
    double dExt;

if(radius ==0)
        return (0.0);

if(cflDebugLevel & DEBUG_LO) printf("rbtExtWSV is at [%u:%u] with value [%f]\n", &rbtExtWSV, rbtExtWSV);
    if(cflDebugLevel & DEBUG_LO) printf("motor[RBT_EXT].scale is at [%u:%u] with value [%f]\n", &motor[RBT_EXT].scale, motor[RBT_EX perfectX = (int)(rbtExtWSV * motor[RBT_EXT].scale);
    fprintf(pCFldgnsf,"rbtExtWSV is at [%u:%u] with value [%f]\n", &rbtExtWSV, rbtExtWSV);
    fprintf(pCFldgnsf,"motor[RBT_EXT].scale is at [%u:%u] with value [%f]\n", &motor[RBT_EXT].scale, motor[RBT_EXT].scale);

if(cflDebugLevel & DEBUG_LO) printf("rbtExtWSV is at [%u:%u] with value [%f]\n", &rbtExtWSV, rbtExtWSV);
    if(cflDebugLevel & DEBUG_LO) printf("motor[RBT_EXT].scale is at [%u:%u] with value [%f]\n", &motor[RBT_EXT].scale, motor[RBT_EX dl = idealSlotDis - (x_Center - base - radius);
    fprintf(pCFldgnsf,"idealSlotDis is at [%u:%u] with value [%d]\n", &idealSlotDis, idealSlotDis);
    if(cflDebugLevel & DEBUG_LO) printf("idealSlotDis is at [%u:%u] with value [%d]\n", &idealSlotDis, idealSlotDis);
    trl = TrlEgMotorEx2Dist(perfectX ,M);
    led = LdEgMotorEx2Dist(perfectX ,M);
    fprintf(pCFldgnsf, "Distance of rbtExtWSV :trialing edge =[%d] leadingedge=[%d]\n",trl, led);
    if(cflDebugLevel & DEBUG_LO) printf("Distance of rbtExtWSV :trialing edge =[%d] leadingedge=[%d]\n",trl, led);
    perfectXDist = (trl + led)/2;
    motorStep = Dist2MotorEx(perfectXDist + dl);
    fprintf(pCFldgnsf," for deviation of [%d] distance we need goto motor coord %d\n",
                     dl, motorStep);
    if(cflDebugLevel & DEBUG_LO) printf(" for deviation of [%d] distance we need goto motor coord %d\n",
```

```c
            d); motorStep);

dExt=((double)perfectX-motorStep)/(motor[RBT_EXT].scale);
    fprintf(pCFIdgnsf, "The needed adjustment in extension is %f\n",dExt);
    if(cfIDebugLevel >= DEBUG_LO) printf("The needed adjustment in extension is %f\n",dExt);
    if(dExt >.2) {
        printf("the adjustment is too large =)%f. Hit any key to continue\n",dExt);
        getch();
    }
    return dExt;
}

PrintRadiuses()/* WZ072186
=================*/
{
    int i;
    int nGoodPts =0;
    int min, max, average;
    double sumErr = 0.0;
    double stdDev;

for(i=0; i< nUsedPts; i++){
        printf("radius[%d] = %d",i, aRadius[i]);
        sumErr = sumErr + Sqr((double)aRadius[i] - radius);
        if (aErrMeasure[i]){
            nGoodPts ++;
            printf("* ");
        } else printf("  ");
        if ((i%2))
            printf("\n");
    }
    if(nUsedPts !=1)
        stdDev = sqrt((double)sumErr/(nUsedPts-1));
    printf("\n* for good radius\n");
    if (nGoodPts !=0){
        MinMax(&min, &max, &average, nGoodPts);
        printf("\nMean = %d, mean - min =%d, max - mean = %d\n",
            average, average-min, max-average);
        printf("Standard deviation = %.1G\n",stdDev);
    } if(nGoodPts < MIN_GOOD_PTS){
        printf("The number of good points=%d is too few \n", nGoodPts);
    }else{
        printf("The number of good points = %d is acceptable\n", nGoodPts);
    }
} double CenterDevRot()/* return the amount of deviation   WZ072386
===================== from the center in rotation */
{
    double rdev;
    extern float rbtRotUSV;

rdev=((double)(y_Center--rbtRotUSV*rbtArmL*unitRotAngle*1000)/(rbtArmL*unitRotAngle*1000));
    if((fabs(rdev) > MAX_DEV){
        printf("\007\nCenterDevRot----- deviation of %.4f is too large\n");
        printf("********** NO MOVE *****************\n");
        return 0;
    }else
        return rdev;
}
/*
* The following functions computes the center  with four
* arbitrary pair of points on the wafer. This is useful when we
* have two flats on the wafer. We first identify the locations of flats,
```

```
* then use the other points to computing the center. In fact, this
* can also be used for the other cases we had, but this method
* involves more computation. So we let the program run these routines
* only when we detect two flats.
*/

Center_YYC(px, py)/*WZ081386
==================*/
int *px, *py;
{
    if(cfiDebugLevel & DEBUG_M1)
        printf("Find center with two flats\n");
    FindMajorFlat();
    if(cfiDebugLevel & DEBUG_M1)
        printf("after locate the major flat\n");
    FindMinorFlat(px, py);
    if(cfiDebugLevel & DEBUG_M1)
        printf("after locate the minor flat\n");
}

FindMajorFlat()/*WZ081386
==================*/
{
    int mfflag ; /* major flat flag */ mfflag = IgnoreMinorFlat();
    LocateFlatPt(mfflag);
}

IgnoreMinorFlat()/* WZ081386
==================*/
{
    int mfetol = 50; /* max flat err tolerance */
    int stepSize = 5;
    int fflag;

while((fflag = FlatDetec(mfetol)) == ERR){
        mfetol += stepSize;
    }
    return (fflag);
}

LocateFlatPt(fflag)/* WZ081386
==================*/
int fflag;
{
    switch(fflag){
        case R_FLAT : DetermineEdge(M, L, R);
                      break;
        case M_FLAT : DetermineEdge(R, L, M);
                      break;
        case L_FLAT : DetermineEdge(M, R, L);
                      break;
        default : printf("\007\ninvalid flat flag [%d]\n", fflag);
                      break;
    }
}

DetermineEdge(g1, g2, b)/* determine the flat edge WZ082386
==========================*/
int g1, g2, b;
{
    aDecFlat[b].flatBit = TRUE;

if((((aDecFlat[g1].midPt+aDecFlat[g2].midPt)/2 )- aDecFlat[b].midPt))0){
        aDecFlat[b].location = TS;
        aWfEdgePts[b*2+1].flat = TRUE;
    }
    else{
```

```
            aUfEdgePts[b*2].flat = TRUE;
            alDedFlat[b].location = LE;
        }
    }

FindMinofFlat(px, py)/* it also returns the center  WZ081386
======================*/
int *px, *py;
{
    int p1, s1, s2, fp1, fp2;
    double dev1, dev2;
    int *px1, *px2, *py1, *py2;
    int i =0;

while(alDedFlat[i].flatBit == FALSE){
        i++;
        /*printf("alDedFlat[%d].flatBit=%d\n",i, alDedFlat[i].flatBit);*/
    }
    if(alDedFlat[i].location == LE){
        p1 = i*2+1;
    }else{
        p1 = i*2;
    } s1 = (i+1)%3;
    s2 = (s1+1)%3;
    if(cfiDebugLevel & DEBUG_LO)  printf("s1 = %d, s2 = %d\n", s1, s2);
    if(cfiDebugLevel & DEBUG_LO)  printf("before standard deviation\n");
    dev1 = Deviation(p1, s1, s2, px1, py1, &fp1);
    if(cfiDebugLevel & DEBUG_LO)  printf("after the first standard deviation\n");
    if(cfiDebugLevel & DEBUG_LO)  printf("s1 = %d, s2 = %d\n", s1, s2);

dev2 = Deviation(p1, s2, s1, px2, py2, &fp2);
    if(cfiDebugLevel & DEBUG_LO)  printf("after the sencod std dev\n");

if(dev1 < dev2){
        *px = *px1;
        *py = *py1;
        aUfEdgePts[fp1].flat = TRUE;
    }
    else {
        *px = *px2;
        *py = *py2;
        aUfEdgePts[fp2].flat = TRUE;
    }
} double Deviation(p1, s1, s2, px, py, pf) /* WZ081386
======================================   */
int p1, s1, s2, *px, *py, *pf;
{
    int radius;
    int p2, p3, p4;

SelectPts(s1, s2, &p2, &p3, &p4, pf);
    Center_XY(p1, p2, p3, p4, px, py);
    radius = GetRadius(*px, *py, *pf);
    if(cfiDebugLevel & DEBUG_LO)  printf("radius = %d\n", radius);
    return(ComputeStdDev(radius, *pf));
}

SelectPts(s1, s2, pp2, pp3, pp4, pf)/* WZ081386
==================================*/
int s1, s2, *pp2, *pp3, *pp4, *pf;
{
    int fedge;

if(alDedFlat[s1].midPt > alDedFlat[s2].midPt){
        fedge = s1*2;
        *pp2 = s1*2 + 1;
    }
```

```
     else {
        fedge = s1*2+1;
        *pp2 = s1*2;
     }
     *pp3 = s2*2;
     *pp4 = s2*2 + 1;
     *pf =fedge;
     /*printf("flag = %d\n", *pf);*/
} double ComputeStdDev(rad, fi)/* WZ081386
========================*/
int rad, fi; /* rad : radius, fi: flag index */
{
   int i, j=0;
   double sumErrS =0.0; /*sum of err square */
   double stdDev;

if(cfiDebugLevel & DEBUG_LO)
        printf("compute standard deviation\n");
   for(i=0; i<6; i++){
        if(!IsAFlat(i,fi)){
            j++;
            sumErrS += Sqr((double)rad - aWfEdgePts[i].disToCtr);
        }
   }
   if(j == 1){
        printf("Too many flats\n");
        return ERR;
   } else
        stdDev = sqrt(sumErrS/(j-1));

return (stdDev);
}

Center_XY(p1, p2, p3, p4, px, py)/* WZ080186
==================================*/
int p1, p2, p3, p4;
int *px, *py;
{
    double a, b, c, d;
    double xa, xb, ya, yb;
    double numx, numy;

if(cfiDebugLevel & DEBUG_LO)
        PrintFourPts(p1, p2, p3, p4);

a = Sqr((double)aWfEdgePts[p1].x) -Sqr((double)aWfEdgePts[p2].x);
    b = Sqr((double)aWfEdgePts[p3].x) -Sqr((double)aWfEdgePts[p4].x);
    c = Sqr((double)aWfEdgePts[p1].y) -Sqr((double)aWfEdgePts[p2].y);
    d = Sqr((double)aWfEdgePts[p3].y) -Sqr((double)aWfEdgePts[p4].y);

xa = (double)2*(aWfEdgePts[p1].x - aWfEdgePts[p2].x);
    xb = (double)2*(aWfEdgePts[p3].x - aWfEdgePts[p4].x);
    ya = (double)2*(aWfEdgePts[p1].y - aWfEdgePts[p2].y);
    yb = (double)2*(aWfEdgePts[p3].y - aWfEdgePts[p4].y);

numy = (b+d)-(a+c)*xb/xa;
    numx = (b+d)-(a+c)*yb/ya;

if(cfiDebugLevel & DEBUG_LO){
        printf("numerator for x= %f\n",xb-(xa*yb)/ya);
        printf("numerator for y= %f\n",yb-(xb*ya)/xa);
    }

*px = (int)(numx/(xb-(xa*yb)/ya));

*py =(int)(numy/(yb-(xb*ya)/xa));

}
```

```c
/******utility routines*****/

GetRadius(xc, yc, fi)/* WZ080486
================*/
int xc, yc, fi;
{
    int radSum = 0;    /* sum of the radii */
    int i, j=0;

/*for(i=0; i < 6; i++){
        printf("i=%d, xc=%d, yc=%d\n", i, xc, yc);
        printf("aWfEdgePts[%d].x = %d, aWfEdgePts[%d].y = %d\n",
            i, aWfEdgePts[i].x,
            i, aWfEdgePts[i].y);
    }
    *****/
    for(i=0; i<6; i++){
        if(NotAFlat(i, fi)){
            j++;

aWfEdgePts[i].disToCtr =(int)sqrt(Sqr((double)aWfEdgePts[i].x-xc) +
                Sqr((double)aWfEdgePts[i].y - yc));
            /*printf("aWfEdgePts[%d].disToCtr=%d\n",i, aWfEdgePts[i].disToCtr);
            */radSum +=aWfEdgePts[i].disToCtr;
        }
    }
    return (radSum/j);
}

NotAFlat(pi, fi)/* WZ081386
================*/
int pi, fi;
{
    if(cfiDebugLevel & DEBUG_LO)
        printf("In Not a flat\n");
    return(((aWfEdgePts[pi].flat == FALSE) && (pi != fi))?1:0);
}

Distance(i, xc, yc) /* Compute the distance from point i to  WZ081386
==================== the center */
int i, xc, yc;
{
    /*printf("aWfEdgePts[%d].x = %d, aWfEdgePts[%d].y = %d\n", i, aWfEdgePts[i].x,
            i, aWfEdgePts[i].y);
    */return((int)(sqrt(Sqr((double)aWfEdgePts[i].x-xc) +
                Sqr((double)aWfEdgePts[i].y - yc))));
}

MinMax(pMin, pMax, pAverage, nGoodPts)/* return ptrs to minimum, maximum WZ072286
============================= and average of the radiuses */
int *pMin, *pMax, *pAverage,nGoodPts;
{
    int i;
    int radSum = 0;

for (i=0; i<nGoodPts-1; i++){
        if(aRadius[i]>aRadius[i+1]){
            Swap(&aRadius[i], &aRadius[i+1]);
        }
    }
    for (i=nGoodPts-2; i>0; i--){
        if(aRadius[i]<aRadius[i-1]){
            swap(&aRadius[i], &aRadius[i-1]);
        }
    }
    for(i=0; i< nGoodPts; i++){
        radSum +=aRadius[i];
```

```
    *pAverage= redSum/nGoodPts;
    *pMin = aRadius[0];
    *pMax = aRadius[nGoodPts-1];
}

Swap(pX, pY)/* exchange the value of the two pointers  WZ072286
=============*/
int *pX, *pY;
{
    int temp;

temp = *pX;
    *pX = *pY;
    *pY = temp;
}

PrintFourPts(p1, p2, p3, p4)/*   WZ061386
===========================*/
int p1, p2, p3, p4;
{
    printf("aWfEdgePts[%d].x = %d, aWfEdgePts[%d].y =%d\n",
        p1, aWfEdgePts[p1].x, p1, aWfEdgePts[p1].y);
    printf("aWfEdgePts[%d].x = %d, aWfEdgePts[%d].y =%d\n",
        p2, aWfEdgePts[p2].x, p2, aWfEdgePts[p2].y);
    printf("aWfEdgePts[%d].x = %d, aWfEdgePts[%d].y =%d\n",
        p3, aWfEdgePts[p3].x, p3, aWfEdgePts[p3].y);
    printf("aWfEdgePts[%d].x = %d, aWfEdgePts[%d].y =%d\n",
        p4, aWfEdgePts[p4].x, p4, aWfEdgePts[p4].y);
}

GetCfiDebugLevel()  /* WZ061283
=================  */
{
    int rEnd;

scr_clr();
    rEnd = PrintCFIDebugCode(0, 10);
    scr_rowcol(rEnd +5, 10);
    printf("Enter Debug Level Code [%4X]", cfiDebugLevel);
    MyScanf("%4x", &cfiDebugLevel);
}

PrintCFIDebugCode(r0, c0) /*
=========================== */
int r0, c0;
{
    scr_rowcol(r0, c0); printf("CenterFinder Debug Level Codes");
    scr_rowcol(r0+1, c0); printf("%4X ... High Level", DEBUG_HI);
    scr_rowcol(r0+2, c0); printf("%4X ... Middle Level", DEBUG_MI);
    scr_rowcol(r0+3, c0); printf("%4X ... Low Level", DEBUG_LO);
    scr_rowcol(r0+4, c0); printf("%4X ... Turn off cfi debug", DEBUG_OF);
    scr_rowcol(r0+5, c0); printf("obtain combination by adding the code");

return r0+6;
}

/**** end of CFI.C ****/
```

Having described preferred and alternative embodiments of the invetnion, what is claimed is:

1. A system for detecting the locus relative to a selected point of an object having leading and trailing edges, such as a semiconductor wafer, positioned on a support movable along a selected path, and for moving the support and object to the selected point, comprising:

a sensor array comprising a plurality of sensors adapted for providing an output signal, said sensors being mounted along an axis generally traverse to the path of movement of said object, said sensors being triggered by the leading and trailing edges of the moving object for supplying output signals representing the wafer position associated with the sensor trigger point;

means responsive to the output signals for calculating the location of the wafer relative to the selected point; and means responsive to the computed relative location of the object for moving the support and the object positioned thereon to the selected point.

2. The system of claim 1, wherein the object is a generally circular semiconductor wafer; the calculating means is adapted for calculating the center of said wafer; and the sensor array comprises three sensors for providing six wafer position points.

3. The system of claim 2, wherein
the object is a generally circular semiconductor wafer;
the calculating means is adapted for calculating the center of said wafer;
the sensor array comprises three sensors;
the movable support means comprises a robot arm adapted for supporting the wafer horizontally thereon and having an orifice at a selected location a known distance from the selected point, the path of movement of said orifice being coincident with one of said sensors for triggering said sensor to provide a reference position for said wafer position points.

4. The system of claim 2, wherein
the object is a generally circular semiconductor wafer;
the calculating means is adapted for calculating the center of said wafer;
the sensor array comprises three sensors;
the movable support means comprises (1) a robot arm adapted for supporting the wafer horizontally thereon and having an orifice at a selected location a known distance from the selected point, the path of movement of said orifice being coincident with one of said sensors for triggering said sensor to provide a reference position for said wafer position points and (2) a dual four-bar link mechanism operatively connected to the robot arm; and
said responsive moving means comprises a rotatable shaft connected to a selected drive arm of the four-bar link mechanism for reciprocally pivoting the drive arm to extend and retract the robot support arm along the path of movement, and means responsive to said location information for rotating said shaft.

5. The system of claim 4, said responsive moving means further comprising a second rotatable shaft mounting the dual four-bar link mechanism for rotation therewith; and means for rotating the second shaft.

6. A method for detecting the locus relative to a selected point of an object having leading and trailing edges, such as a semiconductor wafer, positioned on a movable support, and for moving the support and object along a preselected path to the selected point, comprising:
providing an array of sensors arranged along an axis generally transverse to the path of movement of the object;
moving the object along the path such that the leading and trailing edges thereof trigger the sensors to thereby generate associated output signals representing the wafer positions associated with the sensor trigger points along the path of movement;
responsive to said output signals, calculating the location of said object relative to said reference position and selected point; and
responsive to the calculation of said relative location, stopping movement of the object at said selected point.

7. The method of claim 6, further comprising providing an orifice support at a selected location a known distance from the selected point, the path of movement of said orifice being coincident with one of said sensors for triggering said sensor to provide a reference position for said wafer position points.

8. The method of claim 7, the step of calculating the center of said wafer comprising, first, determining the center of the wafer along a coordinate axis generally parallel to the path of movement and, secondly, using the first center coordinate to determine the center of the wafer along a coordinate axis generally perpendicular to the first axis.

9. A method for detecting the locus relative to a selected point of a semiconductor wafer having leading and trailing edges, positioned on a movable support, and for moving the support and semiconductor wafer along a preselected path to the selected point, comprising:
providing an array of three sensors arranged along an axis generally transverse to the path of movement of said semiconductor wafer;
providing an orifice on the support at a selected location a known distance from the selected point, the path of movement of said orifice being coincident with one of said sensors for triggering said sensor to provide a reference position;
moving the wafer along the preselected path such that the leading and trailing edges thereof trigger the sensors to thereby generate associated output signals representing the wafer positions associated with the sensor trigger points along the path of movement relative to said reference position and said selected point; and
responsive to said output signals, calculating the center of the semiconductor wafer relative to the selected point.

10. The method of claim 9, the step of calculating the center of said wafer comprising, first, determining the center of the wafer along a coordinate axis generally parallel to the path of movement and, secondly, using the first center coordinate to determine the center of the wafer along a coordinate axis generally perpendicular to the first axis.

* * * * *